US012598744B2

(12) United States Patent
Hwang et al.

(10) Patent No.: US 12,598,744 B2
(45) Date of Patent: Apr. 7, 2026

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Sung-Min Hwang, Hwaseong-si (KR); Dongsung Woo, Suwon-si (KR); Tae Gon Lee, Seoul (KR); Bongtae Park, Seoul (KR); Jae-Joo Shim, Suwon-si (KR); Tae-Chul Jung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 629 days.

(21) Appl. No.: 17/747,412

(22) Filed: May 18, 2022

(65) Prior Publication Data

US 2023/0094302 A1     Mar. 30, 2023

(30) Foreign Application Priority Data

Sep. 29, 2021     (KR) ........................ 10-2021-0128826

(51) Int. Cl.
*H10B 41/40*          (2023.01)
*H10B 41/10*          (2023.01)
(Continued)

(52) U.S. Cl.
CPC ............. *H10B 41/40* (2023.02); *H10B 41/10* (2023.02); *H10B 41/27* (2023.02); *H10B 43/10* (2023.02);
(Continued)

(58) Field of Classification Search
CPC ........ H10B 41/40; H10B 41/10; H10B 41/27; H10B 43/10; H10B 43/27; H10B 43/40;
(Continued)

(56) References Cited

U.S. PATENT DOCUMENTS 10,431,595 B1    10/2019   Yang et al.
10,811,356 B2    10/2020   Jung et al.
(Continued)

FOREIGN PATENT DOCUMENTS

KR     10-2013-0091949 A     8/2013
KR     10-2017-0086176 A     7/2017
(Continued)

*Primary Examiner* — Meiya Li
(74) *Attorney, Agent, or Firm* — Wolf, Greenfield & Sacks, P.C.

(57)                    ABSTRACT

A semiconductor device and an electronic system including the same are disclosed. The semiconductor device may include a substrate including a cell array region and a connection region, the cell array region comprising a center region and an outer region; an electrode structure including electrodes and pads; vertical structures on the cell array region and penetrating the electrode structure; and a separation insulating pattern penetrating and dividing an upper electrode, which is one of the electrodes, into at least two portions arranged in a second direction crossing the first direction. The separation insulating pattern comprises a first portion and a second portion, the first portion is between at least some of the central vertical structures, and the second portion is spaced apart from the first portion such that, when viewed in the plan view, the second portion is between at least some of the peripheral vertical structure.

8 Claims, 34 Drawing Sheets

(51) Int. Cl.
    *H10B 41/27*          (2023.01)
    *H10B 43/10*          (2023.01)
    *H10B 43/27*          (2023.01)
    *H10B 43/40*          (2023.01)
    *H10B 80/00*          (2023.01)
    *G11C 16/04*          (2006.01)

(52) U.S. Cl.
    CPC ............. *H10B 43/27* (2023.02); *H10B 43/40*
        (2023.02); *H10B 80/00* (2023.02); *G11C*
        *16/0483* (2013.01)

(58) Field of Classification Search
    CPC ........ H10B 80/00; H10B 43/50; H10B 41/50;
        G11C 16/0483
    See application file for complete search history.

(56)              References Cited

U.S. PATENT DOCUMENTS

| | | | |
|---|---|---|---|
| 2013/0207182 A1 | 8/2013 | Lee et al. | |
| 2019/0035798 A1* | 1/2019 | Hwang | H10B 41/27 |
| 2020/0212061 A1* | 7/2020 | Choi | H10B 43/27 |
| 2020/0303413 A1 | 9/2020 | Shin et al. | |
| 2021/0118861 A1 | 4/2021 | Yun et al. | |
| 2021/0151462 A1 | 5/2021 | Baek | |

FOREIGN PATENT DOCUMENTS

| | | | | |
|---|---|---|---|---|
| KR | 10-2019-0010230 A | | 1/2019 | |
| KR | 10-2020-0037459 A | | 4/2020 | |
| KR | 20210025032 A | * | 3/2021 | |

* cited by examiner

Figure 14:
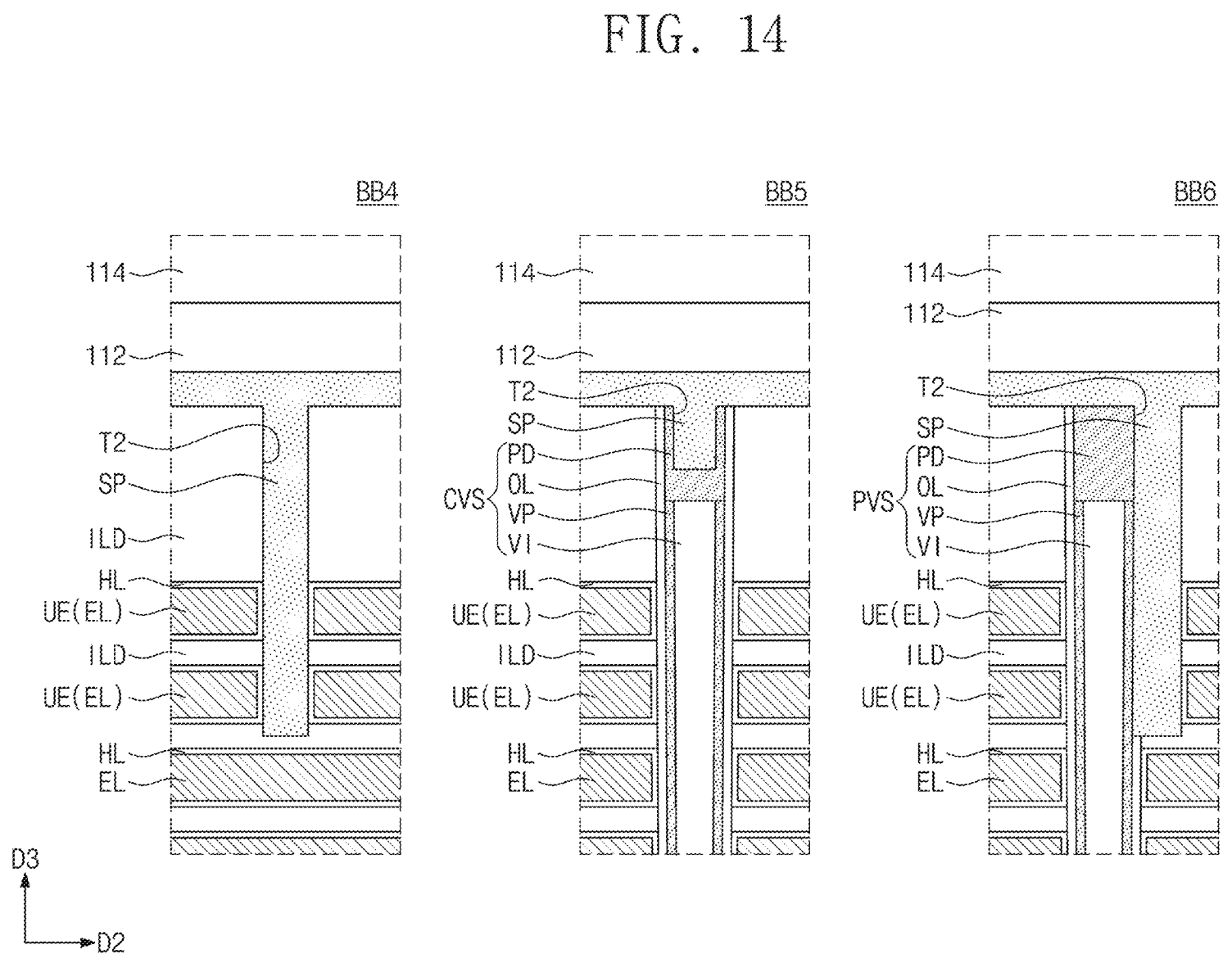

114
112
T2
SP
PD
OL
VP
VI
PVS
HL
UE(EL)
ILD
UE(EL)
HL
EL

BB5

114
112
T2
SP
PD
OL
VP
VI
CVS
HL
UE(EL)
ILD
UE(EL)
HL
EL

BB4

114
112
T2
SP
ILD
HL
UE(EL)
ILD
UE(EL)
HL
EL

SEMICONDUCTOR DEVICE AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2021-0128826, filed on Sep. 29, 2021, in the Korean Intellectual Property Office, the entire contents of which are hereby incorporated by reference.

BACKGROUND OF THE INVENTION

The present disclosure relates to a semiconductor device and an electronic system including the same.

Higher integration of semiconductor devices is required to satisfy consumer demands for superior performance and inexpensive prices. In the case of semiconductor devices, since their integration is a principal factor in determining product prices, increased integration is especially required. In the case of two-dimensional or planar semiconductor devices, since their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices. Thus, three-dimensional semiconductor memory devices including three-dimensionally arranged memory cells have recently been proposed.

SUMMARY

An embodiment of the inventive concepts provides a highly-reliable and high-density semiconductor device.

An embodiment of the inventive concepts provides an electronic system including the semiconductor device.

According to an embodiment of the inventive concepts, a semiconductor device may include a substrate including a cell array region and a connection region, which are arranged in a first direction, the cell array region comprising a center region and an outer region, the outer region between the center region and the connection region; an electrode structure including electrodes and pads, the electrodes vertically stacked on the substrate, and the pads on the connection region in a stepwise manner; vertical structures on the cell array region and penetrating the electrode structure, the vertical structures comprising central vertical structures on the center region and peripheral vertical structures on the outer region; and a separation insulating pattern penetrating and dividing an upper electrode, which is one of the electrodes, into at least two portions arranged in a second direction crossing the first direction. The separation insulating pattern may comprise a first portion and a second portion, the first portion may extend in the first direction such that, when viewed in a plan view, the first portion is between at least some of the central vertical structures, and the second portion may be spaced apart from the first portion in the second direction such that, when viewed in the plan view, the second portion is between at least some of the peripheral vertical structures.

According to an embodiment of the inventive concepts, a semiconductor device may include a substrate including a cell array region and a connection region, which are arranged in a first direction, the cell array region comprising a center region and an outer region, the outer region between the center region and the connection region; an electrode structure including electrodes and pads, the electrodes vertically stacked on the substrate, and the pads on the connection region in a stepwise manner; vertical structures on the cell array region and penetrating the electrode structure, the vertical structures comprising central vertical structures on the center region and peripheral vertical structures on the outer region; a vertical supporting structure penetrating the pads; and a separation insulating pattern penetrating and dividing an upper electrode, which is one of the electrodes, into at least two portions, which are electrically isolated from each other. The vertical structures may comprise a first vertical structure and a second vertical structure, the first vertical structure on the center region and vertically overlapped with the separation insulating pattern, and the second vertical structure on the outer region and vertically overlapped with the separation insulating pattern, and when viewed in a plan view, an overlapping area between the first vertical structure and the separation insulating pattern is larger than an overlapping area between the second vertical structure and the separation insulating pattern.

According to an embodiment of the inventive concepts, an electronic system may include a main substrate; a semiconductor device on the main substrate; and a controller on the main substrate and electrically connected to the semiconductor device. The semiconductor device may comprise a substrate including a cell array region and a connection region, which are arranged in a first direction. The cell array region comprising a center region and an outer region, the outer region between the center region and the connection region, an electrode structure including electrodes and pads, the electrodes vertically stacked on the substrate, and the pads on the connection region in a stepwise manner, vertical structures on the cell array region and penetrating the electrode structure, the vertical structures comprising central vertical structures on the center region and peripheral vertical structures on the outer region, and a separation insulating pattern penetrating and dividing an upper electrode, which is one of the electrodes, into at least two portions arranged in a second direction crossing the first direction. The separation insulating pattern may comprise a first portion and a second portion, the first portion may extend in the first direction such that, when viewed in a plan view, the first portion is between at least some of the central vertical structures, and the second portion may be spaced from the first portion in the second direction such that, when viewed in the plan view, the second portion is between at least some of the peripheral vertical structures.

BRIEF DESCRIPTION OF THE DRAWINGS

FIGS. 3 and 4 are sectional views schematically illustrating semiconductor packages according to some example embodiments of the inventive concepts.

FIG. 8 is an enlarged sectional view illustrating a portion A of FIG. 6.

FIGS. 13 and 14 are enlarged sectional views illustrating a portion of a semiconductor device according to some example embodiments of the inventive concepts and corresponding to portions BB4, BB5, and BB6 of FIG. 12A to 12C.

FIG. 16 is an enlarged plan view illustrating a portion of a semiconductor device according to an embodiment of the inventive concept and corresponding to the portions BB1, BB2, and BB3 of FIG. 7B to 7D.

FIG. 17 is an enlarged plan view illustrating a portion of a semiconductor device according to some example embodiments of the inventive concepts and corresponding to the portion A of FIG. 5.

FIGS. 18 and 19 are enlarged plan views each illustrating a portion of semiconductor devices according to some example embodiments of the inventive concepts.

FIG. 22 is a plan view illustrating a semiconductor device according to some example embodiments of the inventive concepts.

DETAILED DESCRIPTION

Example embodiments of the inventive concepts will now be described more fully with reference to the accompanying drawings, in which some example embodiments are shown.

Figure 1:
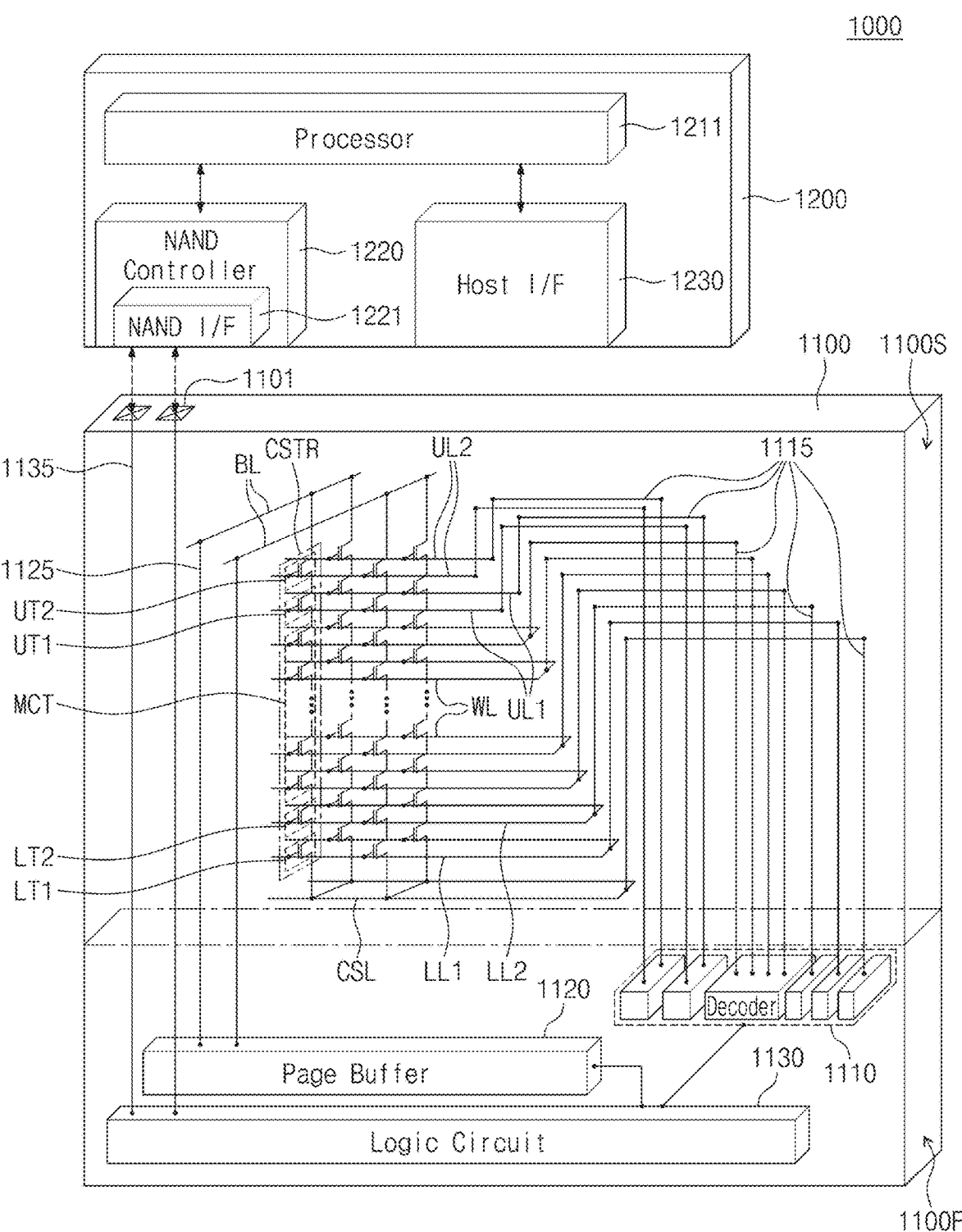
FIG. 1 is a diagram schematically illustrating an electronic system including a semiconductor device according to some example embodiments of the inventive concepts.

FIG. 1 is a diagram schematically illustrating an electronic system including a semiconductor device according to some example embodiments of the inventive concepts.

Referring to FIG. 1, an electronic system 1000 may include a semiconductor device 1100 and a controller 1200 electrically connected to the semiconductor device 1100. The electronic system 1000 may be a storage device, which includes one or more semiconductor devices 1100, and/or an electronic device including the storage device. For example, the electronic system 1000 may be a solid state drive (SSD)

device, a universal serial bus (USB), a computing system, a medical system, a communication system, and/or the like, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. As an example, the first structure 1100F may be disposed beside and/or on top the second structure 1100S. The first structure 1100F may be a peripheral circuit structure including a decoder circuit portion 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to some embodiments.

In some embodiments, the upper transistors UT1 and UT2 may include a string selection transistor, and the lower transistors LT1 and LT2 may include a ground selection transistor. The gate lower lines LL1 and LL2 may be used as gate electrodes of the lower transistors LT1 and LT2, respectively. The word lines WL may be used as gate electrodes of the memory cell transistors MCT, and the gate upper lines UL1 and UL2 may be used as gate electrodes of the upper transistors UT1 and UT2, respectively.

In some embodiments, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT2 may be used for an erase operation of erasing data, which are stored in the memory cell transistors MCT, using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit portion 1110 through first connection lines 1115, which are extended from the first structure 1100F to the second structure 1100S. The bit lines BL may be electrically connected to the page buffer 1120 through second connection lines 1125, which are extended from the first structure 1100F to the second structure 1100S.

In the first structure 1100F, the decoder circuit portion 1110 and the page buffer 1120 may be configured to perform a control operation on at least one transistor that is selected from the memory cell transistors MCT. The decoder circuit portion 1110 and the page buffer 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which is extended from the first structure 1100F to the second structure 1100S.

The controller 1200 may include a processor 1210, a NAND controller 1220, and a host interface 1230. In some embodiments, the electronic system 1000 may include a plurality of semiconductor devices 1100, and in this case, the controller 1200 may control the semiconductor devices 1100.

The processor 1211 may control overall operations of the electronic system 1000 including the controller 1200 and may include or be implemented in processing circuitry such as hardware including logic circuits; a hardware/software combination such as a processor executing software; or a combination thereof. For example, the one or more processors more specifically may include, but are not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 1211, for example, may be operated based on a specific firmware and may control the NAND controller 1220 to access the semiconductor device 1100. The NAND controller 1220 may include a NAND interface 1221 which is used for communication with the semiconductor device 1100. The NAND interface 1221 may be used to transmit and receive control commands, which are used to control the semiconductor device 1100, and data, which will be written in or read from the memory cell transistors MCT of the semiconductor device 1100. The host interface 1230 may be configured to allow for communication between the electronic system 1000 and an external host. When a control command is received from the external host through the host interface 1230, the processor 1211 may control the semiconductor device 1100 in response to the control command.

Figure 2:
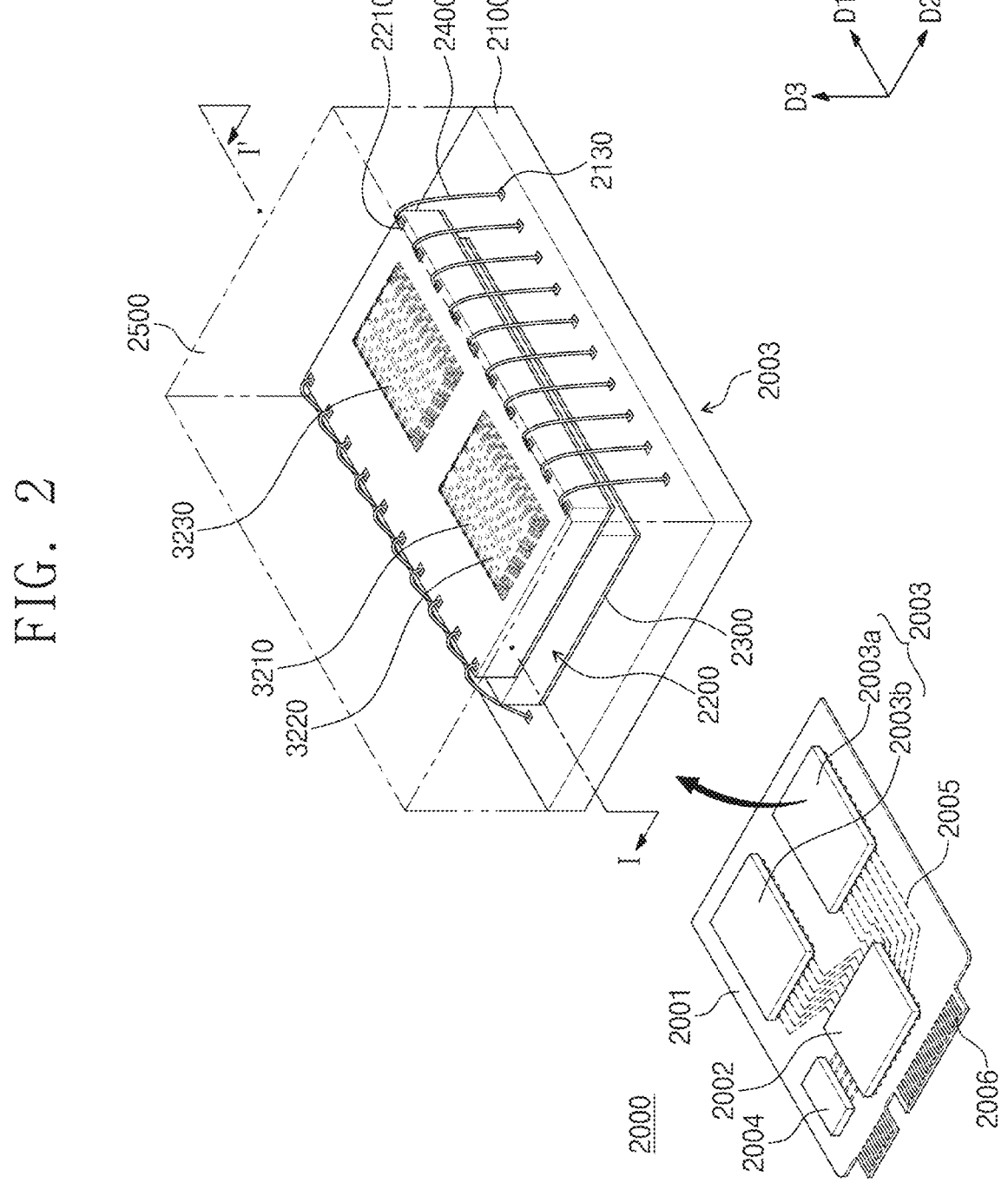
FIG. 2 is a perspective view schematically illustrating an electronic system including a semiconductor device according to some example embodiments of the inventive concepts.

FIG. 2 is a perspective view schematically illustrating an electronic system including a semiconductor device according to some example embodiments of the inventive concepts.

Referring to FIG. 2, an electronic system 2000 may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 through interconnection patterns 2005, which are formed in the main substrate 2001.

The main substrate 2001 may include a connector 2006, which includes a plurality of pins which may be coupled to an external host (not illustrated). In the connector 2006, the number and arrangement of the pins may depend on a communication interface between the electronic system 2000 and the external host. In some embodiments, the electronic system 2000 may communicate with the external host, in accordance with the interface and/or interface protocols, such as universal serial bus (USB), peripheral component interconnect express (PCI-Express), serial advanced technology attachment (SATA), universal flash storage (UFS) M-PHY, and/or the like. In some embodiments, the electronic system 2000 may be driven by an electric power, which is supplied from the external host through the connector 2006. The electronic system 2000 may further include a power management integrated circuit (PMIC) that is configured to separately supply an electric power, which is provided from the external host to the controller 2002 and the semiconductor package 2003.

The controller 2002 may be configured to control a writing and/or reading operation on the semiconductor package 2003 and to improve an operation speed of the electronic system 2000.

The DRAM 2004 may be a buffer memory relieving technical difficulties caused by a difference in speed between the semiconductor package 2003, which may serve as a data storage device, and an external host. In some embodiments, the DRAM 2004 in the electronic system 2000 may serve as a cache memory and may provide a storage space to temporarily store data during a control operation on the semiconductor package 2003. In the case where the electronic system 2000 includes the DRAM 2004, the controller 2002 may further include a DRAM controller to control the DRAM 2004, in addition to a NAND controller to control the semiconductor package 2003.

The semiconductor package 2003 may include first and second semiconductor packages 2003*a* and 2003*b*, which are spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200 on the package substrate 2100, adhesive layers 2300 respectively disposed on bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be, for example, a printed circuit board including package upper pad portions 2130. Each of the semiconductor chips 2200 may include an input/output pad portion 2210. The input/output pad portion 2210 may correspond to the input/output pad 1101 of FIG. 1. Each of the semiconductor chips 2200 may include gate stacks 3210 and vertical structures 3220. Each of the semiconductor chips 2200 may include a semiconductor device, which will be described below, according to some example embodiments of the inventive concepts.

In some embodiments, the connection structure 2400 may be a bonding wire electrically connecting the input/output pad portion 2210 to the package upper pad portions 2130. In each of the first and second semiconductor packages 2003*a* and 2003*b*, the semiconductor chips 2200 may be electrically connected to each other in a bonding wire manner and may be electrically connected to the package upper pad portions 2130 of the package substrate 2100. In some embodiments, the semiconductor chips 2200 in each of the first and second semiconductor packages 2003*a* and 2003*b* may be electrically connected to each other by a connection structure including through silicon vias (TSVs) (e.g., not by the connection structure 2400 provided in the form of bonding wires).

In some embodiments, the controller 2002 and the semiconductor chips 2200 may be included in a single package. In some embodiments, the controller 2002 and the semiconductor chips 2200 may be mounted on a separate interposer substrate, which is prepared independent of the main substrate 2001, and may be connected to each other through interconnection lines, which are provided in the interposer substrate.

Figure 3:
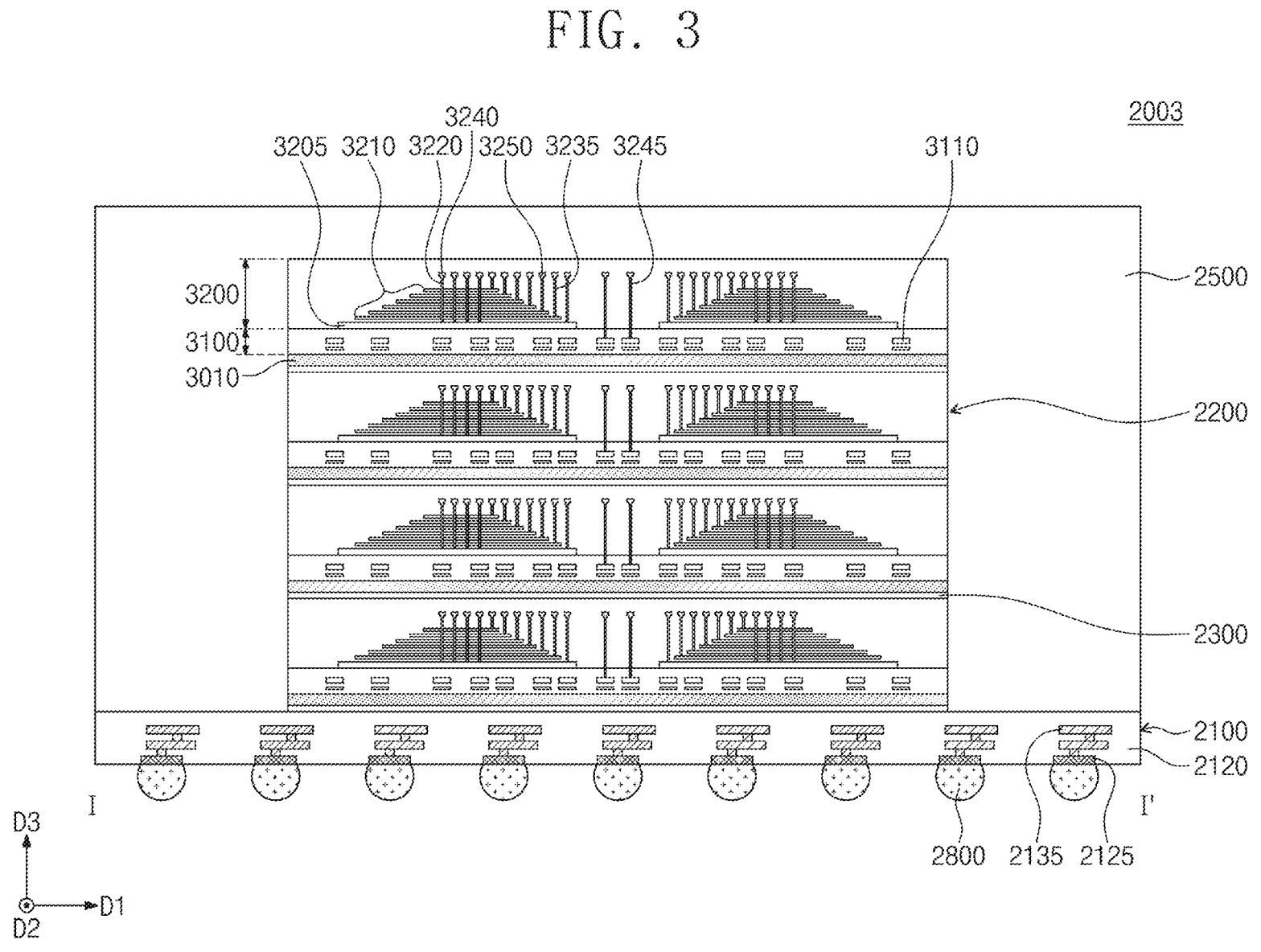
Figure 4:
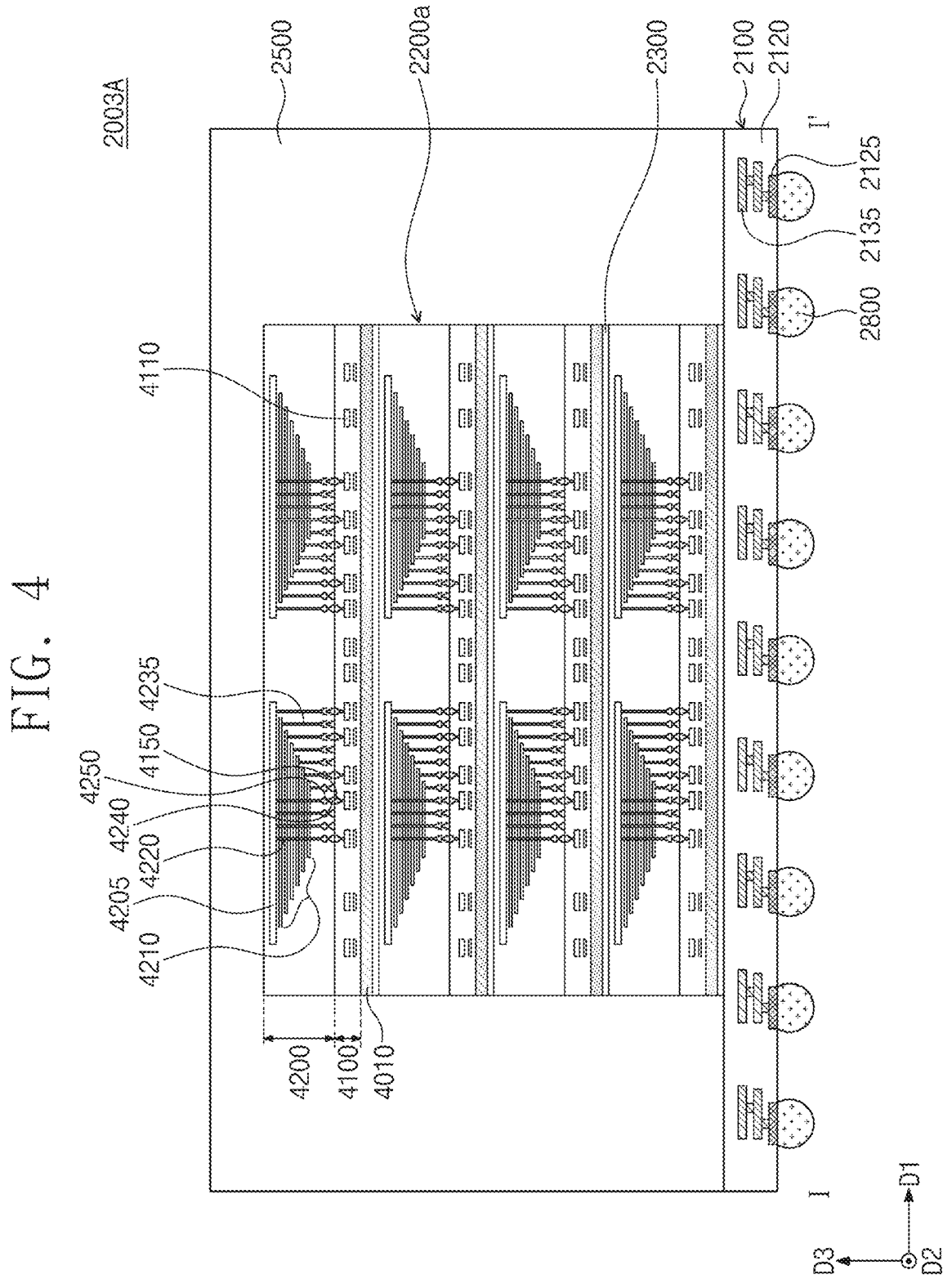

FIGS. 3 and 4 are sectional views schematically illustrating a semiconductor package according to some example embodiments of the inventive concepts. FIGS. 3 and 4 are sectional views taken along a line I-I' of FIG. 2 to conceptually illustrate two different examples of the semiconductor package of FIG. 2.

Referring to FIG. 3, in the semiconductor package 2003, the package substrate 2100 may be a printed circuit board.

The package substrate 2100 may include a package substrate body portion 2120, the package upper pad portions 2130 (e.g., of FIG. 2) disposed on a top surface of the package substrate body portion 2120, lower pad portions 2125, which are disposed on or exposed through a bottom surface of the package substrate body portion 2120, and internal lines 2135, which are provided in the package substrate body portion 2120 to electrically connect the package upper pad portions 2130 to the lower pad portions 2125. The lower pad portions 2125 may be connected to the interconnection patterns 2005 of the main substrate 2001 of the electronic system 2000 through conductive connecting portions 2800, as shown in FIG. 2.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a source structure 3205, the stack 3210 on the source structure 3205, the vertical structures 3220 penetrating the stack 3210, bit lines 3240 electrically connected to the vertical structures 3220, and cell contact plugs 3235 electrically connected to the word lines WL (e.g., see FIG. 1) of the stack 3210. The second structure 3200 may further include separation structures (see, e.g., 3230 of FIG. 2 and/or SS1 of FIGS. 5 and 6).

Each of the semiconductor chips 2200 may include penetration lines 3245, which are electrically connected to the peripheral lines 3110 of the first structure 3100 and are extended into the second structure 3200. The penetration line 3245 may be disposed outside the stack 3210 or may be disposed to penetrate the stack 3210. Each of the semiconductor chips 2200 may further include the input/output pad portions 2210 (e.g., of FIG. 2), which are electrically connected to the peripheral lines 3110 of the first structure 3100. Referring to FIG. 4, in a semiconductor package 2003A, each of the semiconductor chips 2200a may include a semiconductor substrate 4010, a first structure 4100 on the semiconductor substrate 4010, and a second structure 4200, which is provided on the first structure 4100 and is bonded with the first structure 4100 in a wafer bonding manner.

The first structure 4100 may include a peripheral circuit region, in which a peripheral line 4110 and first junction structures 4150 are provided. The second structure 4200 may include a source structure 4205, a stack 4210 between the source structure 4205 and the first structure 4100, vertical structures 4220 penetrating the stack 4210, and second junction structures 4240, which are electrically and respectively connected to the vertical structures 4220 and the word lines WL (e.g., see FIG. 1) of the stack 4210. For example, the second junction structures 4240 may be electrically connected to the vertical structures 4220 through bit lines 4250, which are electrically connected to the vertical structures 4220, and may be electrically connected to the word lines WL (e.g., see FIG. 1) through cell contact plugs 4235, which are electrically connected to the word lines WL (e.g., see FIG. 1). The first junction structures 4150 of the first structure 4100 and the second junction structures 4240 of the second structure 4200 may be in contact with each other and may be bonded to each other. Portions of the first and second junction structures 4150 and 4240, which are bonded to each other, may be formed of a conductive material, for example, copper (Cu). Each of the semiconductor chips 2200a may further include the input/output pad portions 2210 (e.g., see FIG. 2) which are electrically connected to the peripheral lines 4110 of the first structure 4100.

The semiconductor chips 2200 of FIG. 3 and the semiconductor chips 2200a of FIG. 4 may be connected to each other by the connection structures 2400 (e.g., see FIG. 2) including bonding wires. However, in some embodiments, the semiconductor chips (e.g., 2200 or 2200a of FIG. 3 or 4), which are provided in a single semiconductor package, may be electrically connected to each other by a connection structure including through silicon vias (TSVs).

The first structure 3100 of FIG. 3 and the first structure 4100 of FIG. 4 may correspond to, for example, a peripheral circuit structure in the example embodiments to be described below, and/or the second structure 3200 of FIG. 3 and the second structure 4200 of FIG. 4 may correspond to a cell array structure in the example embodiments to be described below.

Figure 5:
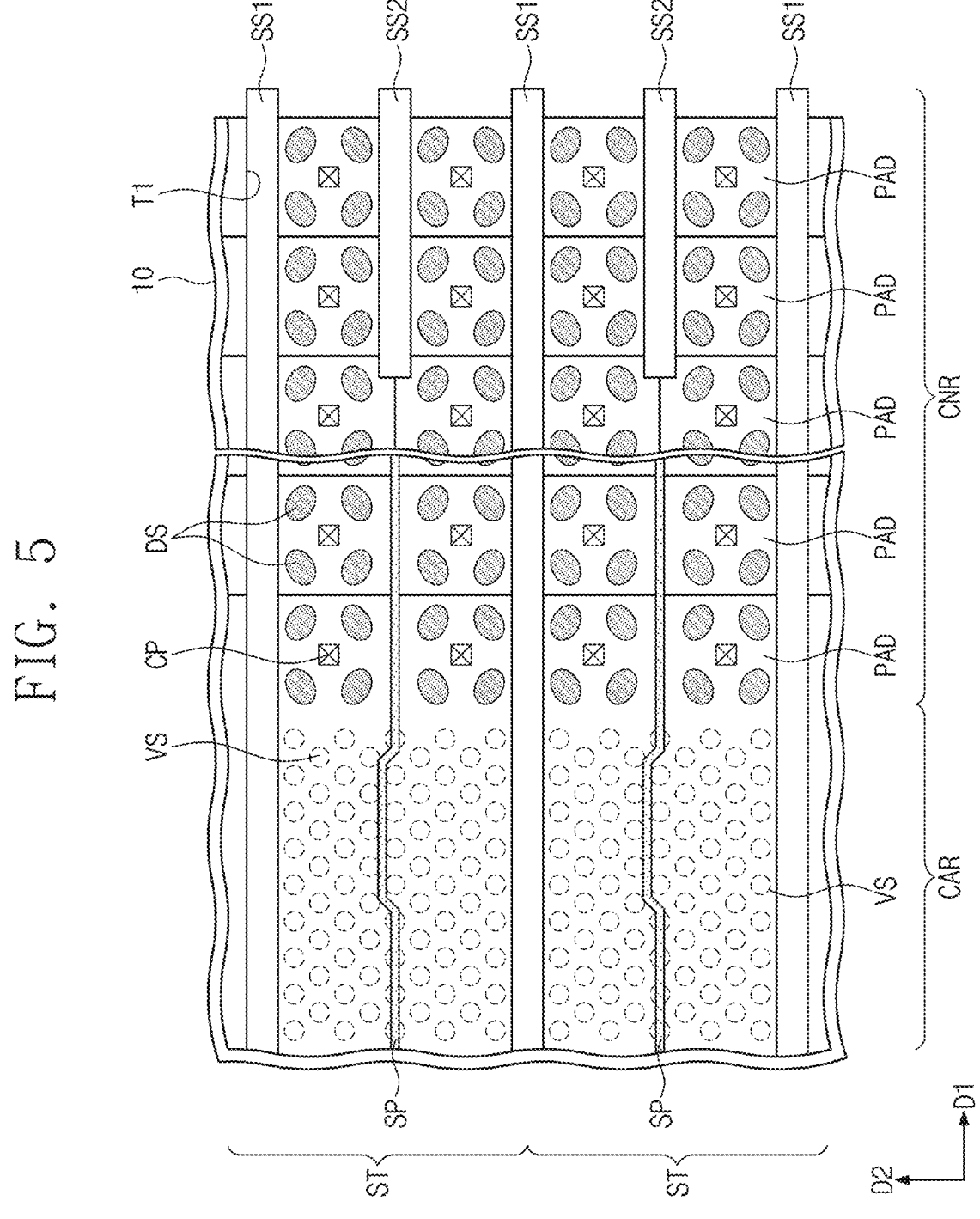
FIG. 5 is a plan view illustrating a semiconductor device according to some example embodiments of the inventive concepts.

FIG. 5 is a plan view illustrating a semiconductor device according to some example embodiments of the inventive concepts.

Referring to FIGS. 1 and 5, electrode structures ST may be provided on a substrate 10. The substrate 10 may include a cell array region CAR and a connection region CNR, which are arranged in a first direction D1. The memory cell strings CSTR of FIG. 1 may be provided on the cell array region CAR of the substrate 10, and interconnection lines, which are used to connect the memory cell strings CSTR to the decoder circuit portion 1110, may be provided on the connection region CNR.

The electrode structures ST may be provided on the cell array region CAR and the connection region CNR of the substrate 10. The electrode structures ST may be extended in the first direction D1 and may be spaced apart from each other in a second direction D2 crossing the first direction D1. Each of the electrode structures ST may be provided between separation structures SS1, which are extended in the first direction D1. For example, the separation structures SS1 may be provided between two adjacent ones of the electrode structures ST to electrically separate the two adjacent ones of the electrode structures ST from each other. Auxiliary separation structures SS2 extending in the first direction D1 may be provided in the electrode structures ST. The auxiliary separation structures SS2 may be provided on the connection region CNR to partially separate the electrode structures ST from each other. The auxiliary separation structures SS2 may be located between two adjacent ones of the separation structures SS1.

The electrode structures ST may include the gate upper lines UL1 and UL2, the word lines WL, and the gate lower lines LL1 and LL2 described with reference to FIG. 1. The electrode structures ST may have pads PAD, which are provided on the connection region CNR and are arranged in the first and second directions D1 and D2. The pads PAD may be connected to the gate upper lines UL1 and UL2, the word lines WL, and the gate lower lines LL1 and LL2, respectively. The pads PAD may be configured to easily connect the gate upper lines UL1 and UL2, the word lines WL, and the gate lower lines LL1 and LL2 to respective interconnection lines. The pads PAD may be electrically connected to the decoder circuit portion 1110 through cell contact plugs CP.

Vertical structures VS may be provided on the cell array region CAR of the substrate 10. The vertical structures VS may be arranged in the first and second directions D1 and D2. At least one of the vertical structures VS may include a data storing element. At least some of the vertical structures VS may be used as the memory cell strings CSTR and may be controlled by the word lines WL and the bit lines BL.

Vertical supporting structures DS may be provided on the connection region CNR of the substrate 10. The vertical supporting structures DS may be placed around the cell contact plugs CP provided on the pads PAD, respectively. A size (e.g., the largest diameter) of each of the vertical supporting structures DS may be larger than that of each of the vertical structures VS.

Separation insulating patterns SP may be provided on the substrate 10. The separation insulating patterns SP may be disposed between the separation structures SS1 and may be extended from the cell array region CAR to the connection region CNR. The separation insulating patterns SP may be configured to divide each of the gate upper lines UL1 and UL2 of the electrode structures ST into a plurality of portions, which are electrically disconnected from each other. For example, at least a portion of the separation insulating patterns SP may be inserted into the electrode structures ST, and a structure of the separation insulating patterns SP will be described in more detail below with reference to sectional views.

The separation insulating patterns SP may have a line shape, when viewed in a plan view. The separation insulating patterns SP may have portions that are extended in the first direction D1. Portions of the separation insulating pattern SP may be located at various positions in the second direction D2, depending on functions and dispositions of structures adjacent thereto. The separation insulating patterns SP may be overlapped with some of the vertical structures VS. Each of the separation insulating patterns SP may have a plurality of portions, which are disposed on the cell array region CAR to have at least two different overlapping areas with the vertical structures VS. In some embodiments, each of the separation insulating patterns SP may have a portion, which is disposed on the connection region CNR and is aligned to the auxiliary separation structures SS2 in the first direction D1.

Hereinafter, the semiconductor device according to some embodiments of the inventive concepts will be described in more detail with reference to one of the electrode structures ST.

Figure 6:
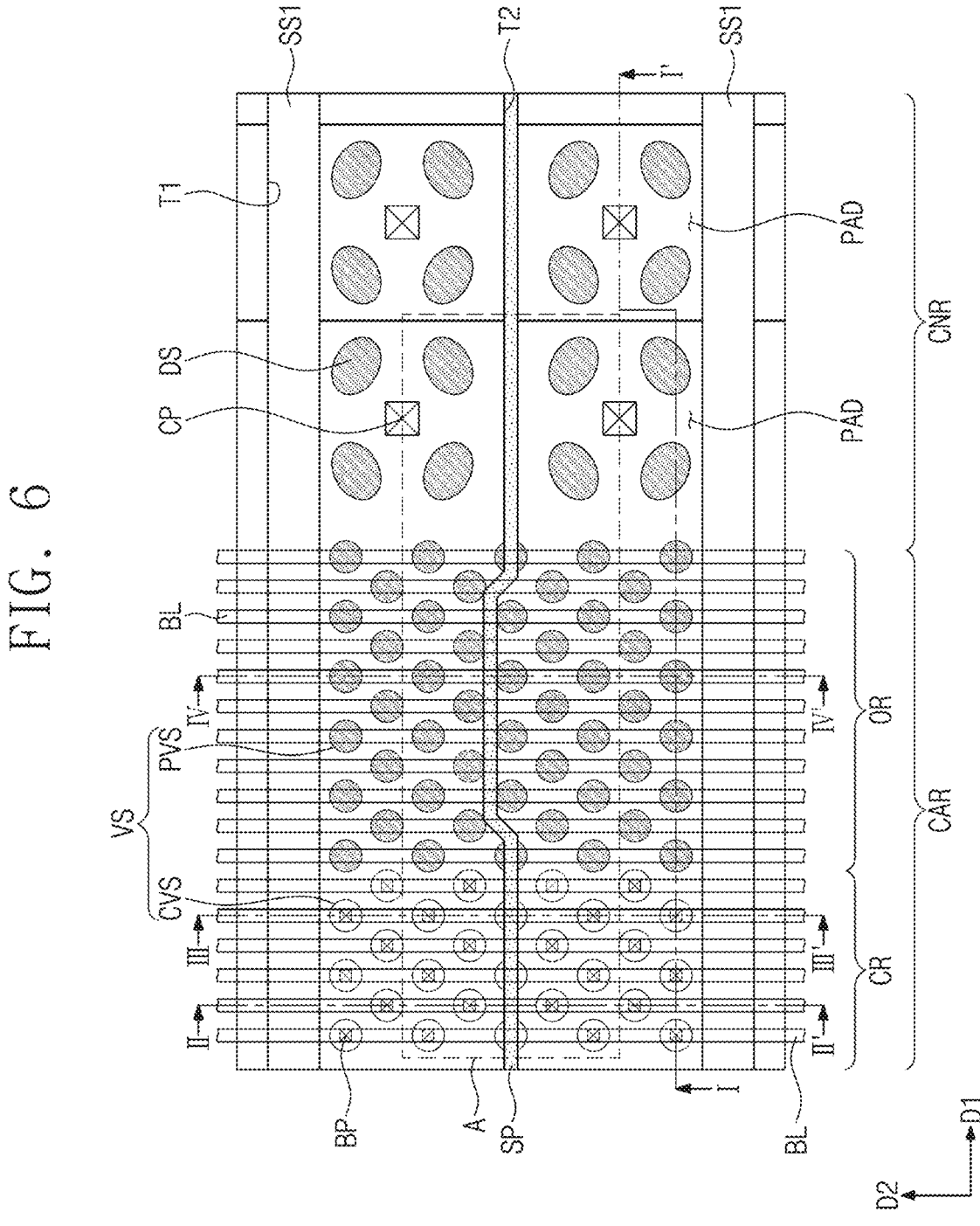
FIG. 6 is an enlarged plan view illustrating a portion of a semiconductor device according to some example embodiments of the inventive concepts.
Figure 8:
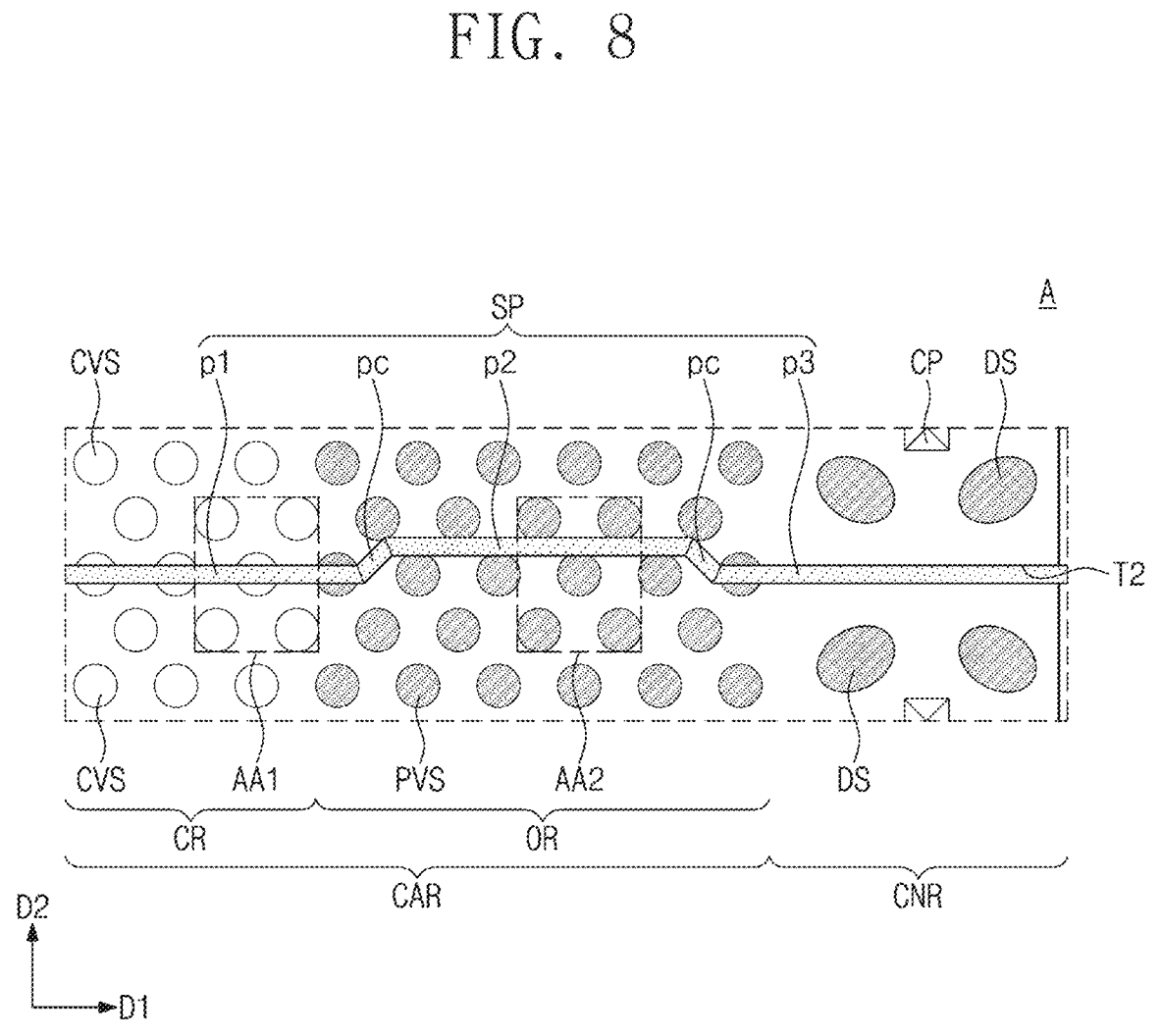
Figure 9:
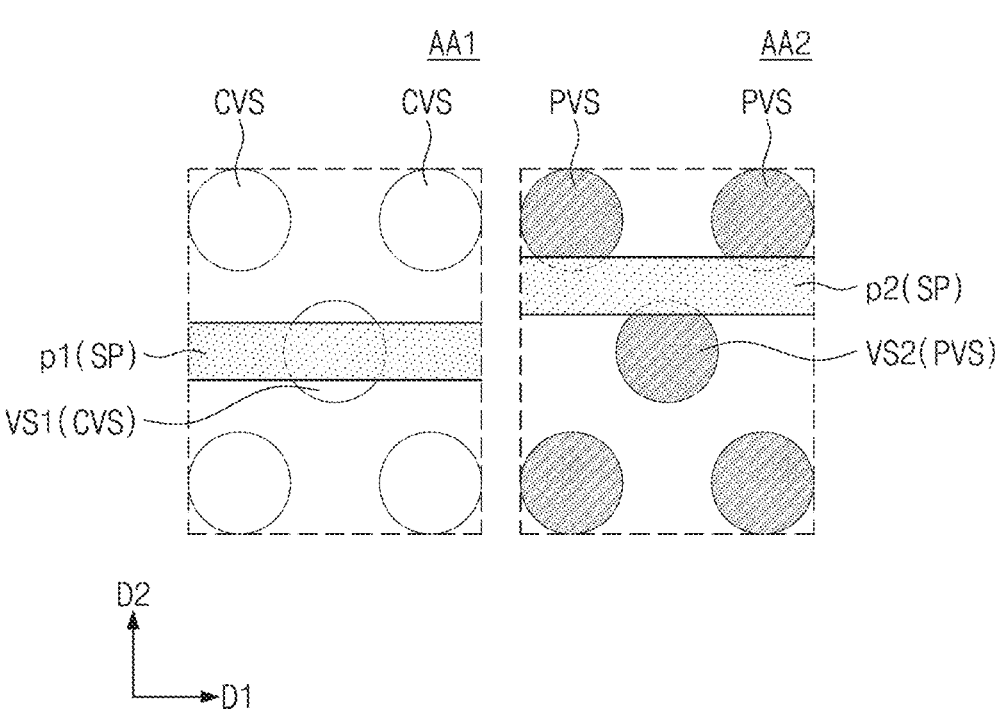
FIG. 9 is an enlarged sectional view illustrating portions AA1 and AA2 of FIG. 8.
Figure 10:
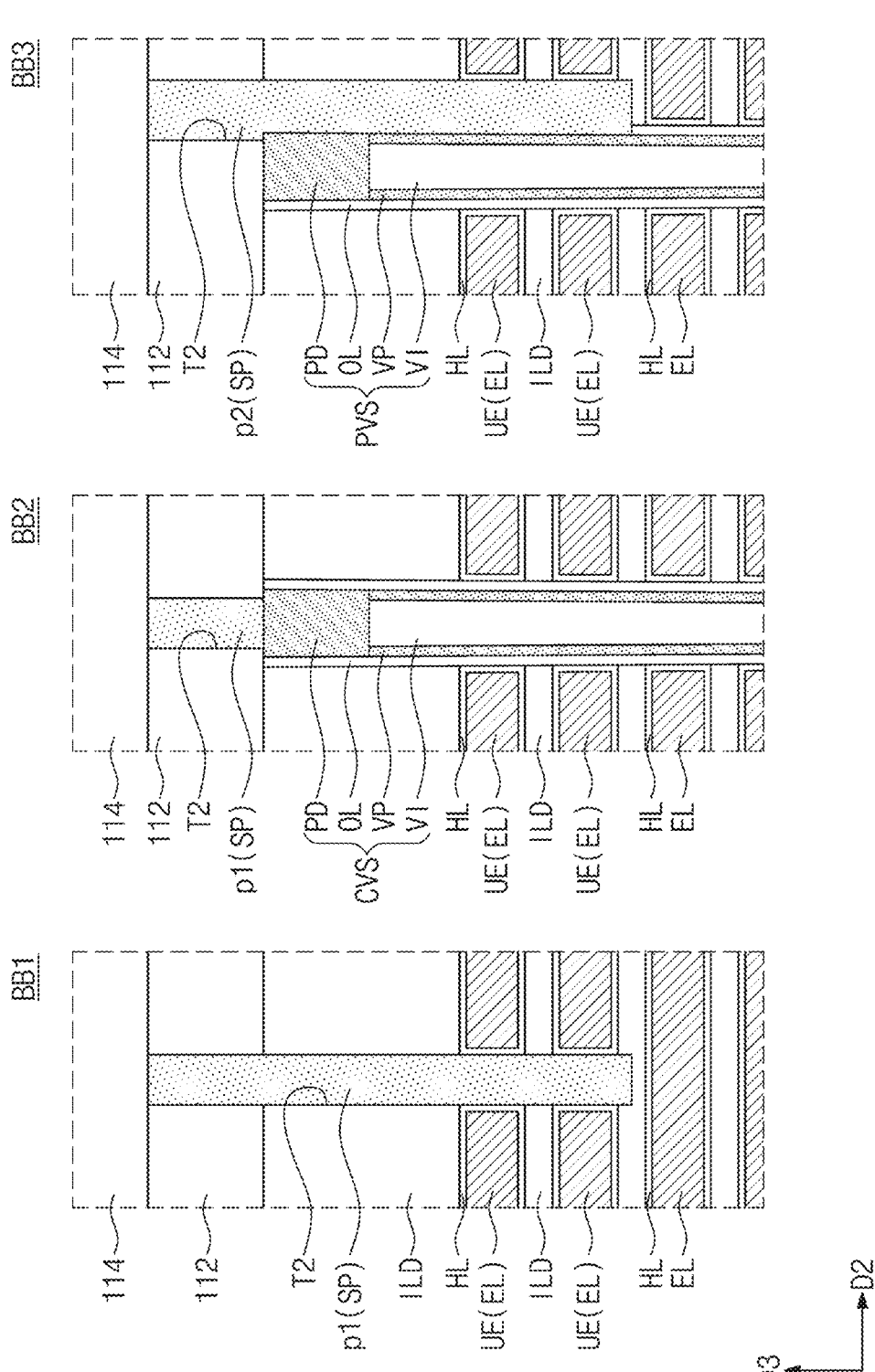
FIG. 10 is an enlarged sectional view illustrating portions BB1, BB2, and BB3 of FIG. 7B to 7D.
Figure 11:
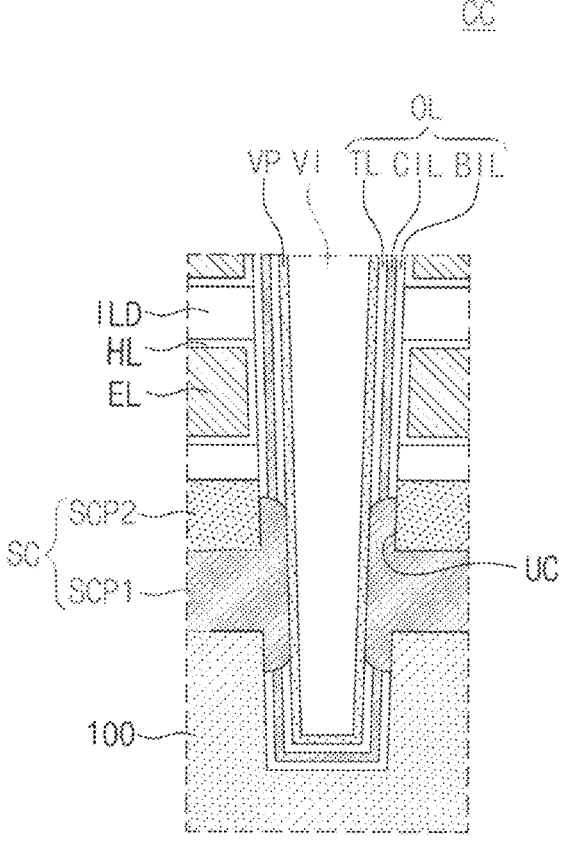
FIG. 11 is an enlarged sectional view illustrating a portion CC of FIG. 7A.

FIG. 6 is an enlarged plan view illustrating a portion of a semiconductor device according to some embodiments of the inventive concepts. FIGS. 7A to 7D are sectional views taken along lines I-I', II-II', III-III', and IV-IV', respectively, of FIG. 6. FIG. 8 is an enlarged sectional view illustrating a portion A of FIG. 6. FIG. 9 is an enlarged sectional view illustrating portions AA1 and AA2 of FIG. 8. FIG. 10 is an enlarged sectional view illustrating portions BB1, BB2, and BB3 of FIG. 7B to 7D. FIG. 11 is an enlarged sectional view illustrating a portion CC of FIG. 7A.

Referring to FIGS. 6 and 7A to 7D, a peripheral circuit structure PS may be provided, and in some embodiments, the peripheral circuit structure PS may include the substrate 10 and peripheral transistors PTR. A cell array structure CS including the electrode structure ST may be provided on the peripheral circuit structure PS. The substrate 10 may be a semiconductor substrate such as a silicon substrate, a silicon-germanium substrate, a germanium substrate, a single-crystalline epitaxial layer grown on a single-crystalline silicon substrate, and/or the like. The substrate 10 may include active regions defined by a device isolation layer 11. The peripheral transistors PTR may be a part of the decoder circuit, the page buffer, and the logic circuit described with reference to FIG. 1.

The peripheral circuit structure PS may include lower interconnection lines 33, which are provided on the peripheral transistors PTR, and a lower insulating layer 50, which is provided to cover the peripheral transistors PTR and the lower interconnection lines 33. Peripheral contacts 31 may be provided between the lower interconnection lines 33 and the peripheral transistor PTR. The peripheral contacts 31 may be provided to electrically connect the peripheral transistors PTR to the lower interconnection lines 33. The lower insulating layer 50 may include a plurality of vertically-stacked insulating layers. For example, the lower insulating layer 50 may include a silicon oxide layer, a silicon nitride layer, a silicon oxynitride layer, a low-k dielectric layer, and/or the like.

The cell array structure CS may be disposed on the lower insulating layer 50. The cell array structure CS may include a lower semiconductor layer 100, a source structure SC, the electrode structure ST, and the vertical structures VS.

The lower semiconductor layer 100 may be disposed on a top surface of the lower insulating layer 50. The lower semiconductor layer 100 may be formed of and/or include at least one semiconductor material (e.g., silicon (Si), germanium (Ge), silicon germanium (SiGe), gallium arsenic (GaAs), indium gallium arsenic (InGaAs), aluminum gallium arsenic (AlGaAs), and/or the like). The lower semiconductor layer 100 may be formed of and/or include a doped semiconductor material of a first conductivity type and/or an undoped intrinsic semiconductor material. The first conductivity type may be, for example, n-type. The lower semiconductor layer 100 may have at least one of single-crystalline, amorphous, and/or poly-crystalline structures. The lower semiconductor layer 100 may have a top surface that is extended in two orthogonal directions (e.g., the first and second directions D1 and D2).

The source structure SC may be disposed between the electrode structure ST and the lower semiconductor layer 100. The source structure SC may be parallel to a top surface of the lower semiconductor layer 100 and may be extended parallel to the electrode structure ST and in the first and second directions D1 and D2. The source structure SC may include a first horizontal pattern SCP1 and a second horizontal pattern SCP2 on the first horizontal pattern SCP1. The first horizontal pattern SCP1 and the second horizontal pattern SCP2 may be sequentially stacked on the lower semiconductor layer 100. Each of the first and second horizontal patterns SCP1 and SCP2 may be formed of or include a doped semiconductor material of the first conductivity type. For example, the first and second horizontal patterns SCP1 and SCP2 may be formed of or include a semiconductor material that is doped with n-type dopants. For example, the dopants may include phosphorus (P) or arsenic (As). In some embodiments, the first horizontal pattern SCP1 may have an n-type dopant concentration that is higher than that of the second horizontal pattern SCP2.

The electrode structure ST may be disposed on the lower semiconductor layer 100. The electrode structure ST may be placed between the separation structures SS1, which are extended in the first direction D1 and parallel to each other. The electrode structure ST may be spaced apart from the lower semiconductor layer 100 with the source structure SC interposed therebetween. The electrode structure ST may be extended from the cell array region CAR to the connection region CNR in the first direction D1.

The electrode structure ST may include electrodes EL and insulating patterns ILD, which are alternately stacked in a direction perpendicular to the top surface of the lower semiconductor layer 100 (e.g., a third direction D3). The electrodes EL and the insulating patterns ILD may be located between a pair of the separation structures SS1, which are adjacent to each other in the second direction D2. The electrodes EL may have substantially the same thickness, and the insulating patterns ILD may have at least two different thicknesses according to the desired characteristics of the semiconductor device. One of the insulating patterns ILD on the top surface of the uppermost electrode EL may be thicker than the others of the insulating patterns ILD. Each of the electrodes EL may be formed of or include conductive materials, such as at least one of doped semiconductor materials (e.g., doped silicon), metallic materials (e.g., tungsten, copper, or aluminum), conductive metal nitrides (e.g., titanium nitride or tantalum nitride), and/or transition metals (e.g., titanium or tantalum). Each of the insulating patterns ILD may be formed of or include, e.g., silicon oxide.

The electrode structure ST may have a stepwise structure on the connection region CNR. The stepwise structure of the electrode structure ST may have a decreasing height, with increasing distance from the cell array region CAR. For example, the stepwise structure of the electrode structure ST may have a decreasing height as a distance from the cell array region CAR in the first direction D1 increases (see, e.g., FIG. 3) or may have an increasing height as a distance from the cell array region CAR in the first direction D1 increases (see, e.g., FIG. 4). The stepwise structure of the electrode structure ST may have the pads PAD, which are arranged in a stepwise manner. The pads PAD may be portions of the electrodes EL. A portion of the electrode EL defining the pad PAD may not be veiled by another electrode EL that is directly placed on the same. The pads PAD may be configured to independently connect respective ones of the electrodes EL to the peripheral circuit structure PS. Adjacent ones of the pads PAD may be spaced apart from each other in three different directions (e.g., the first, second, and third directions D1, D2, and D3).

The vertical structures VS may be provided on the cell array region CAR to penetrate the electrode structure ST. The vertical structures VS may be arranged in the first and second directions D1 and D2. In some embodiments, the vertical structures VS may be arranged in an array. For example, as shown in FIG. 6, five vertical structures VS may be arranged in the second direction D2 to constitute a first column, and four vertical structures VS may be arranged in the second direction D2 to constitute a second column. The first and second columns may be arranged such that they are alternately repeated in the first direction D1. A diameter of each of the vertical structures VS may gradually decrease with decreasing distance to the substrate 10. The vertical structures VS may have top surfaces which are located at the same level as a top surface of the uppermost one of the insulating patterns ILD of the electrode structure ST. The vertical structures VS may have bottom surfaces which are located at a level lower than the top surface of the lower semiconductor layer 100.

Referring to FIGS. 6, 7A to 7D, and 10, the vertical structures VS may include a gapfill insulating pattern VI, a vertical semiconductor pattern VP, a vertical insulating pattern OL, and a conductive pad PD.

The vertical semiconductor pattern VP may be interposed between the vertical insulating pattern OL and the gapfill insulating pattern VI. The vertical semiconductor pattern VP may be shaped like a pipe with an open top end. The vertical semiconductor pattern VP may be spaced apart from the electrodes EL with the vertical insulating pattern OL interposed therebetween. The vertical semiconductor pattern VP may be formed of and/or include at least one semiconductor material (e.g., silicon (Si) and/or germanium (Ge)). Furthermore, the vertical semiconductor pattern VP may be formed of and/or include a doped semiconductor material, an undoped, and/or intrinsic semiconductor material. The vertical semiconductor pattern VP may be used as channel regions of memory cell transistors constituting a cell string of a NAND Flash memory device.

The gapfill insulating pattern VI may cover an inner surface of the vertical semiconductor pattern VP. The gapfill insulating pattern VI may be spaced apart from the vertical insulating pattern OL with the vertical semiconductor pattern VP interposed therebetween. The gapfill insulating pattern VI may have a circular pillar shape.

The conductive pad PD may cover a top surface of the vertical semiconductor pattern VP and a top surface of the gapfill insulating pattern VI. The conductive pad PD may be formed of and/or include at least one of a doped semiconductor material and/or a metallic material. In some embodiments, the conductive pad PD may be formed of and/or include polysilicon.

The vertical insulating pattern OL may be provided to enclose the vertical semiconductor pattern VP. The vertical insulating pattern OL may be provided to cover an outer surface of the vertical semiconductor pattern VP. The vertical insulating pattern OL may be composed of a single thin film and/or a plurality of thin films. The vertical insulating pattern OL may be shaped like a pipe with an open top end.

Referring to FIG. 11, the vertical insulating pattern OL may include a tunnel insulating layer TL, a charge storing layer CIL, and a blocking insulating layer BIL. The vertical insulating pattern OL may be a data storing layer of a NAND FLASH memory device. The vertical insulating pattern OL may be vertically divided into two portions by an undercut region UC. The undercut region UC may be filled with the first horizontal pattern SCP1.

The charge storing layer CIL may be a trap insulating layer, a floating gate electrode, and/or an insulating layer with conductive nanodots. The charge storing layer CIL may include at least one of a silicon nitride layer, a silicon oxynitride layer, a silicon-rich nitride layer, a nanocrystalline silicon layer, and/or a laminated trap layer. The tunnel insulating layer TL may be formed of and/or include a material whose band gap is greater than the charge storing layer CL. The tunnel insulating layer TL may include a high-k dielectric layer (e.g., an aluminum oxide layer and/or a hafnium oxide layer) and/or a silicon oxide layer. The blocking insulating layer BIL may include a silicon oxide layer and/or an aluminum oxide layer.

An electrode barrier layer HL may be provided between the electrodes EL and the insulating patterns ILD. The electrode barrier layer HL may be extended into a region between the electrode EL and the vertical structures VS. The electrode barrier layer HL may be formed of and/or include at least one of metal nitrides (e.g., titanium nitride, tantalum nitride, and tungsten nitride). The electrode barrier layer HL may further include at least one transition metal (e.g., titanium and tantalum), in addition to the metal nitride. In some embodiments, the electrode barrier layer HL may be formed of and/or include at least one of high-k metal oxides (e.g., aluminum oxide or hafnium oxide).

Referring back to FIGS. 6 and 7A to 7D, the vertical supporting structures DS may be provided on the connection region CNR. The vertical supporting structures DS may be provided to penetrate the stepwise structure of the electrode structure ST. The vertical supporting structures DS may be formed during the process of forming the vertical structures VS and may have a structure similar to the vertical structures VS. The vertical supporting structures DS may not be used as the channel regions of the memory cell transistors, unlike the vertical structures VS. The vertical supporting structures DS may not be electrically connected to the bit lines BL, which will be described below. In some embodiments, the vertical supporting structures DS may have no function in terms of circuitry. The vertical supporting structures DS may serve as pillars (e.g., a supporter) that mechanically supports the stepwise structure of the electrode structure ST. When viewed in a plan view, a size (e.g., the largest diameter) of each of the vertical supporting structures DS may be larger than that of each of the vertical structures VS.

A planarization insulating layer 111 may be provided on the electrode structure ST. The planarization insulating layer 111 may cover the stepwise structure of the electrode structure ST. In some embodiments, a top surface of the planarization insulating layer 111 may be coplanar with the top surface of the uppermost one of the insulating patterns ILD of the electrode structure ST. The planarization insulating layer 111 may be formed of or include at least one of, for example, silicon oxide, silicon nitride, silicon oxynitride, and/or the like.

A first interlayer insulating layer 112 and a second interlayer insulating layer 114 may be sequentially provided on the electrode structure ST. The first interlayer insulating layer 112 may cover the top surfaces of the vertical structures VS and the top surfaces of the vertical supporting structures DS. In some embodiments, each of the first and second interlayer insulating layers 112 and 114 may be formed of and/or include at least one of silicon oxide, silicon nitride, silicon oxynitride, and/or the like.

The separation structures SS1 may be disposed to cross the electrode structure ST. The separation structures SS1 may be extended in the first direction D1 and parallel to each other and may be spaced apart from each other in the second direction D2. The separation structures SS1 may be extended from the cell array region CAR to the connection region CNR to fully cross the electrode structure ST. A pair of the separation structures SS1, which are adjacent to each other in the second direction D2, may separate the electrodes EL in the electrode structure ST from the electrodes EL in neighboring electrode structures. In addition, the adjacent pair of the separation structures SS1 may separate the source structure SC, which is placed below the bottom surface of each electrode structure ST, from neighboring source structures. The separation structures SS1 may be provided to fill separation trenches T1, respectively, which are formed between the electrode structures ST. Each of the separation structures SS1 may have a line shape or a bar shape. The separation structures SS1 may include an insulating material. For example, the separation structures SS1 may be formed of and/or include silicon oxide.

The separation structures SS1 may have top surfaces which are located at the same level as a top surface of the first interlayer insulating layer 112. The top surfaces of the separation structures SS1 may be coplanar with the top surface of the first interlayer insulating layer 112. Bottom surfaces of the separation structures SS1 may be located at a level that is not higher than a bottom surface of the source structure SC. The separation structures SS1 may have protruding portions, which are extended toward side surfaces of the first horizontal pattern SCP1. Each of the protruding portions may be located between a bottom surface of the second horizontal pattern SCP2 and the top surface of the lower semiconductor layer 100. The auxiliary separation structures SS2 described with reference to FIG. 5 may have a structure that is similar to the separation structures SS1 but may not fully cross the electrode structure ST, unlike the separation structures SS1. The separation structures SS1 may be covered with the second interlayer insulating layer 114.

The bit lines BL may be disposed on a top surface of the second interlayer insulating layer 114. The bit lines BL may be disposed on the cell array region CAR. The bit lines BL may be arranged in the first direction D1 and may be extended in the second direction D2 to be parallel to each other. Some of the bit lines BL may be electrically connected to some of the vertical structures VS through bit line contacts BP.

Upper interconnection lines CL may be disposed on the top surface of the second interlayer insulating layer 114. The upper interconnection lines CL may be disposed on the connection region CNR. The upper interconnection lines CL may be electrically connected to the pads PAD of the electrode structure ST through the cell contact plugs CP. Although not shown, the bit lines BL and the upper interconnection lines CL may be electrically connected to the lower interconnection lines 33 of the peripheral circuit structure PS through penetration contacts.

The cell array region CAR may include a center region CR and an outer region OR between the center region CR and the connection region CNR. The vertical structures VS may include central vertical structures CVS on the center region CR and peripheral vertical structures PVS on the outer region OR. The peripheral vertical structures PVS may be disposed in a region closer to the connection region CNR than the central vertical structures CVS. In some embodiments, the central vertical structures CVS and the peripheral vertical structures PVS may have the same diameter and/or width in the first direction D1.

The central vertical structures CVS may be electrically connected to the bit lines BL through the bit line contacts BP. Each of the central vertical structures CVS may include the memory cell strings CSTR described with reference to FIG. 1. By contrast, the bit line contacts BP may not be provided between the peripheral vertical structures PVS and the bit lines BL. For example, the peripheral vertical structures PVS may be electrically disconnected from the bit lines BL. The peripheral vertical structures PVS may be dummy vertical structures and may have no function in terms of circuitry. Top surfaces of the peripheral vertical structures PVS may be fully covered with the first interlayer insulating layer 112.

The separation insulating pattern SP may be extended in the first direction D1 to cross the electrode structure ST. The separation insulating pattern SP may be provided to penetrate upper electrodes UE, which are upper ones of the electrodes EL of the electrode structure ST. The upper electrodes UE may be the gate upper lines UL1 and UL2 described with reference to FIG. 1. For example, the upper electrodes UE may be respectively used as the gate electrodes of the string selection transistors UT1 and UT2 described with reference to FIG. 1. The electrode structure ST is illustrated to include two upper electrodes UE, but in some embodiments, the electrode structure ST may include three or more upper electrodes UE. In some embodiments, the separation insulating pattern SP may be provided to penetrate three or more electrodes EL. The separation insulating pattern SP may be provided in a trench T2, which is formed to extend from the top surface of the first interlayer insulating layer 112 toward the substrate 10. In some embodiments, a top surface of the separation insulating pattern SP may be located at a level higher than the top surfaces of the vertical structures VS. For example, the top surface of the separation insulating pattern SP may be located at the same level as the top surface of the first interlayer insulating layer 112. A level of a bottom surface of the separation insulating pattern SP may vary depending on a position of the separation insulating pattern SP or on whether the separation insulating pattern SP is overlapped with the vertical structures VS.

The separation insulating pattern SP may divide each of the upper electrodes UE into a plurality of portions, which are electrically disconnected from each other. For example, the separation insulating pattern SP may divide each of the upper electrodes UE into two portions, which are spaced apart from each other in the second direction D2. The two portions of the upper electrode UE, which are spaced apart from each other by the separation insulating pattern SP, may be independently controlled through the cell contact plugs CP.

Referring to FIGS. 6 to 10, the separation insulating pattern SP may include a first portion p1 on the center region CR, a second portion p2 on the outer region OR, a third portion p3 on the connection region CNR, and connection portions pc connecting the first to third portions p1 to p3 each other. Each of the first to third portions p1 to p3 may be extended in the first direction D1. The connection portions pc may be extended in a direction, which is not parallel to the first and second directions D1 and D2, to connect adjacent two of the first to third portions p1 to p3 to each other.

Figure 7A:
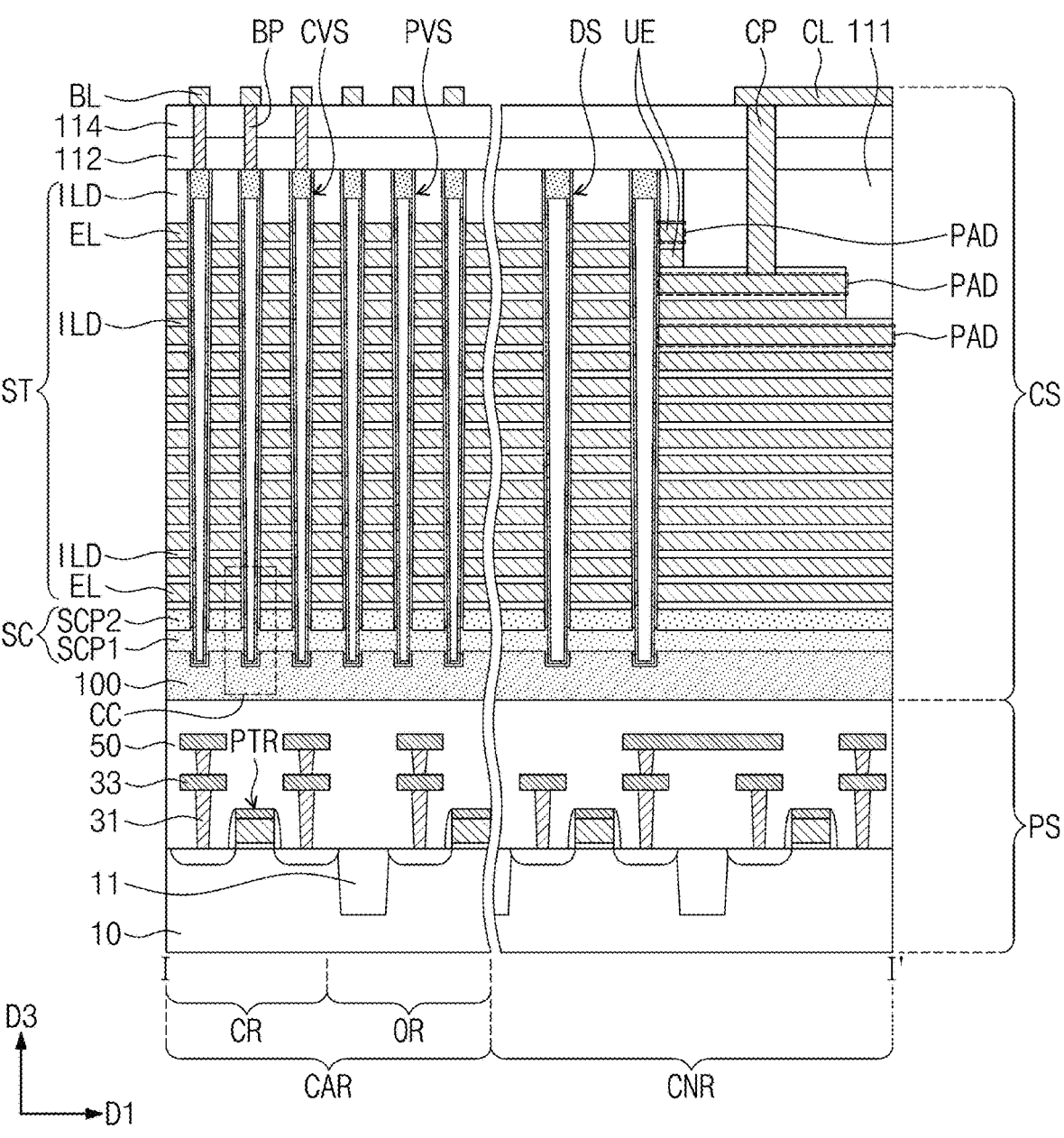
FIGS. 7A to 7D are sectional views taken along lines I-I', II-II', III-III', and IV-IV', respectively, of FIG. 6.
Figure 7B:
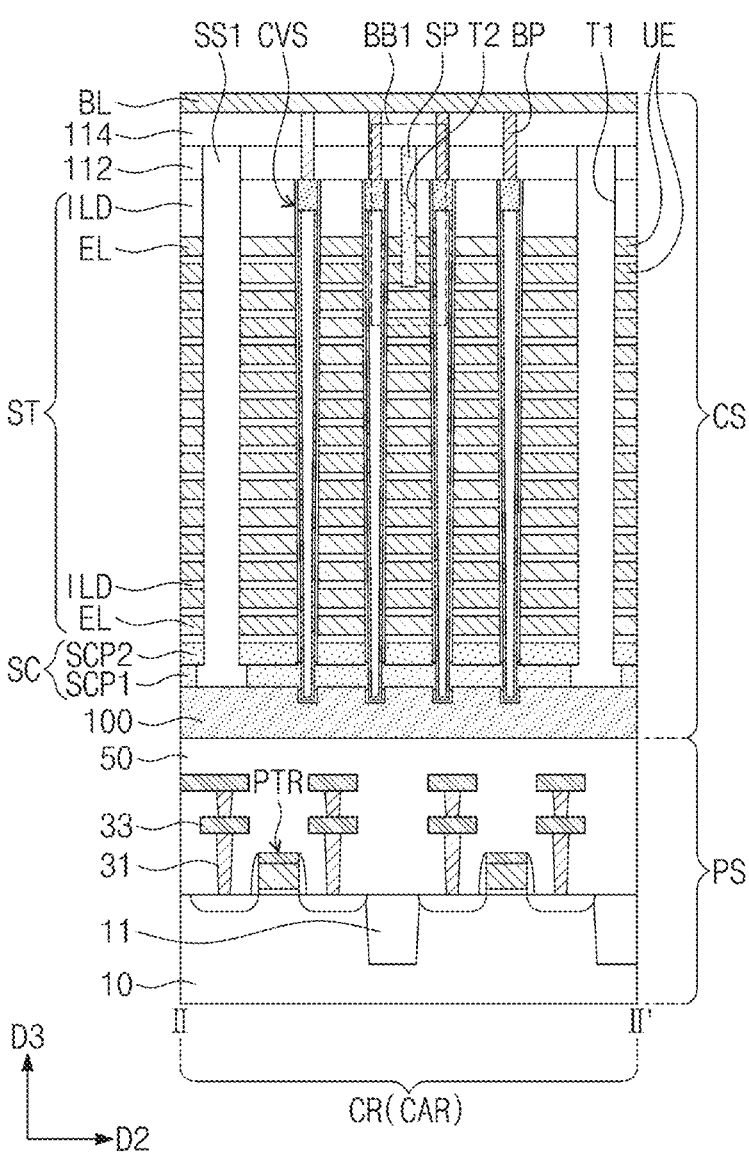
Figure 7C:
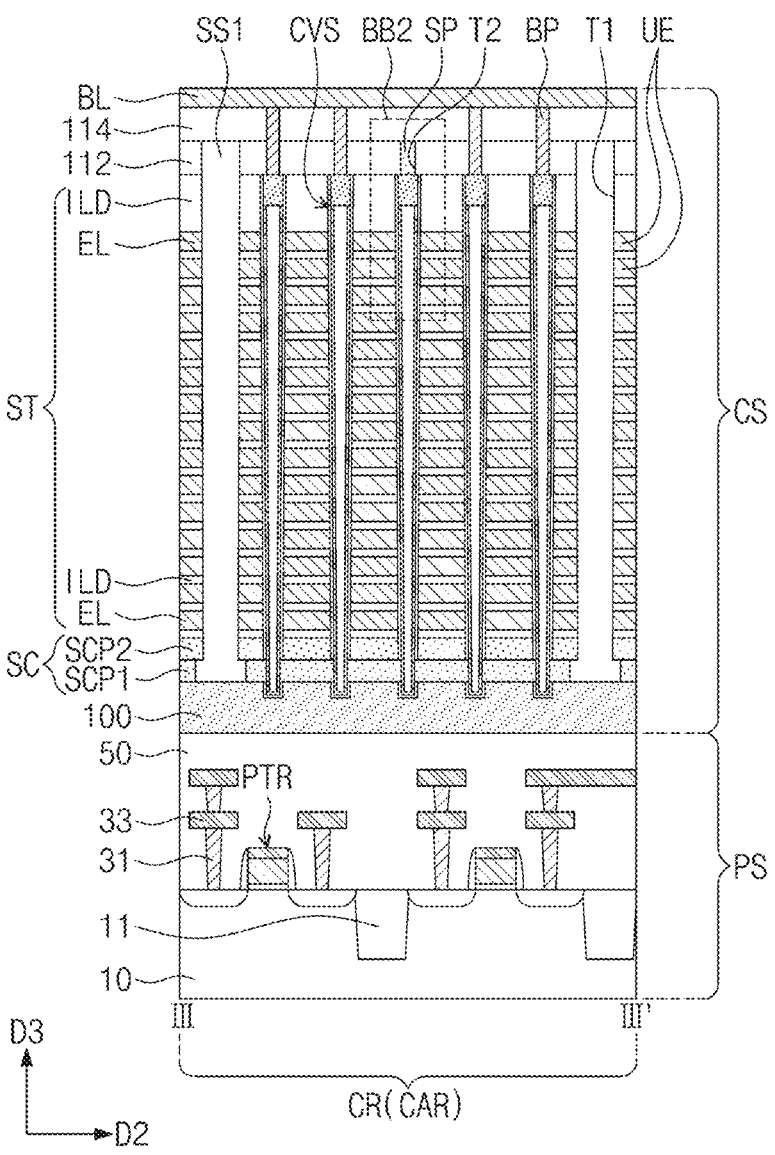

The first portion p1 of the separation insulating pattern SP may be located on a center line of equally bisecting the electrode structure ST in the second direction D2. As shown in FIG. 7B, the first portion p1 may be provided to equally bisect each of the upper electrodes UE, which are placed between the separation structures SS1, in the second direction D2. For example, the two portions of the upper electrodes UE, which are spaced apart from each other in the second direction D2 with the first portion p1 interposed therebetween, may have the same length in the second direction D2. The first portion p1 may be vertically overlapped with some of the central vertical structures CVS. The first portion p1 may be overlapped with centers of some of the central vertical structures CVS, as shown in FIG. 7C. The central vertical structures CVS, which are vertically overlapped with the first portion p1, may be electrically disconnected from the bit lines BL. For example, the central vertical structures CVS, which are vertically overlapped with the first portion p1, may serve as dummy central vertical structures and may have no function in terms of circuitry. The bit line contacts BP may not be provided between the dummy central vertical structures and the bit lines BL. The dummy central vertical structures may be arranged in the first direction D1.

A level of a bottom surface of the first portion p1 on a region overlapped with the central vertical structures CVS may be different from that on a non-overlapped region. The level of the bottom surface of the first portion p1 between central vertical structures CVS may be located at a level lower than bottom surfaces of the upper electrodes UE. The level of the bottom surface of the first portion p1 on the region overlapped with the central vertical structures CVS may be located at a level higher than top surfaces of the upper electrodes UE. The first portion p1 on the region overlapped with the central vertical structures CVS may cover a top surface of the conductive pad PD.

The second portion p2 of the separation insulating pattern SP may be spaced apart from the first portion p1 in the second direction D2. For example, the second portion p2 of the separation insulating pattern SP may be offset from a center of the electrode structure ST in the second direction D2. The second portion p2 may be provided to penetrate a portion of the vertical insulating pattern OL. The second portion p2 may not penetrate the conductive pad PD and may cover a side surface of the conductive pad PD. A bottom surface of the second portion p2 may be located at a level lower than the bottom surfaces of the upper electrodes UE.

The third portion p3 of the separation insulating pattern SP may be located between the vertical supporting structures DS. The third portion p3 may be extended in the first direction D1, between the pads PAD of the electrode structure ST.

The connection portions pc of the separation insulating pattern SP may be located between the first and second portions p1 and p2 and between the second and third portions p2 and p3. The connection portions pc may be extended in a direction, which is not parallel to both of the first and second directions D1 and D2, to connect the first to third portions p1 to p3 to each other. The separation insulating pattern SP may be continuously extended from the cell array region CAR to the connection region CNR. The separation insulating pattern SP may have a line shape, when viewed in a plan view.

Referring to FIGS. 8 and 9, the central vertical structures CVS may include a first vertical structure VS1, which is vertically overlapped with the separation insulating pattern SP on the center region CR. The peripheral vertical structures PVS may include a second vertical structure VS2, which is vertically overlapped with the separation insulating pattern SP on the outer region OR. The first portion p1 of the separation insulating pattern SP may be located on a center of the first vertical structure VS1. The second portion p2 of the separation insulating pattern SP may be located on an outer portion of the second vertical structure VS2, which is spaced apart from the center of the second vertical structure VS2. The second portion p2 of the separation insulating pattern SP may be provided to cross a region between the peripheral vertical structures PVS, which are adjacent to each other in a diagonal direction (e.g., a direction crossing both of the first and second directions D1 and D2). When viewed in a plan view, an overlapping area between the first vertical structure VS1 and the separation insulating pattern SP may be larger than an overlapping area between the second vertical structure VS2 and the separation insulating pattern SP. Since the overlapping areas on the center region CR and the outer region OR are different from each other, it may be possible to reduce the potential for a process failure in a process of forming the separation insulating pattern SP. For example, the separation insulating pattern SP may reduce the potential for a fault line to propagate through a trench in which the separation insulating pattern SP is formed while increasing the process margin during the formation of the separation insulating pattern SP.

Figure 12A:
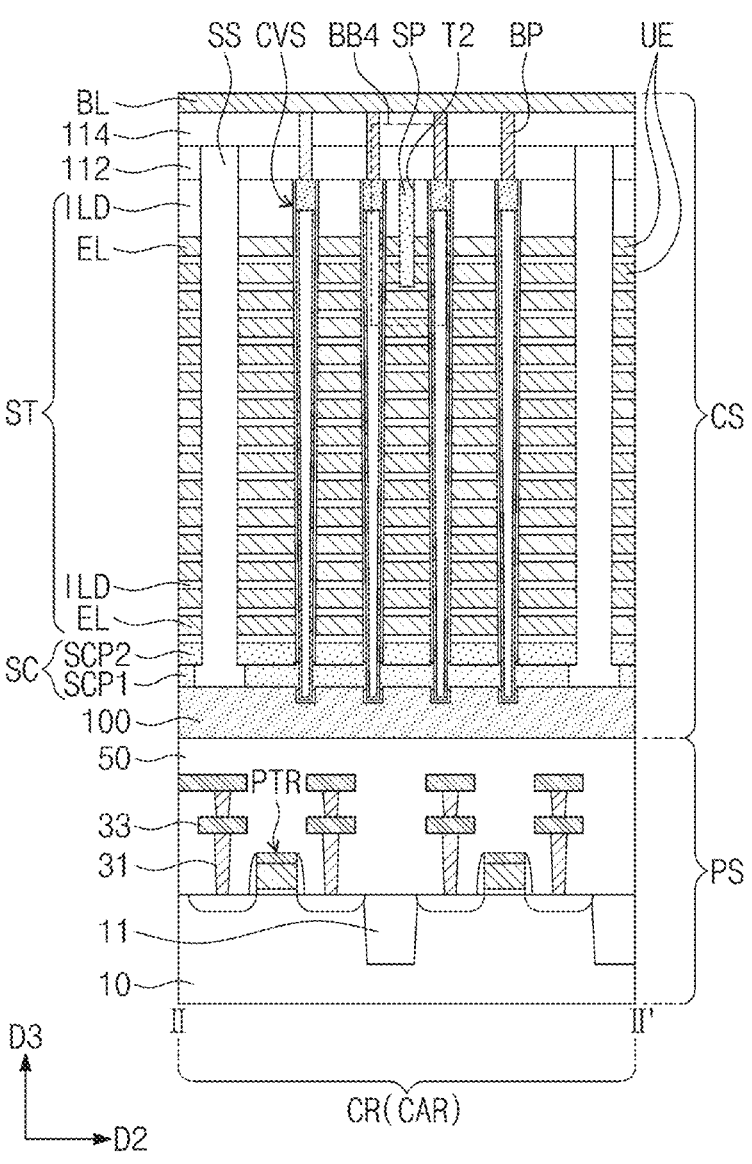
FIGS. 12A to 12C are sectional views, which are respectively taken along lines II-II', III-III', and IV-IV' of FIG. 6 to illustrate a portion of a semiconductor device according to some example embodiments of the inventive concepts.
Figure 12B:
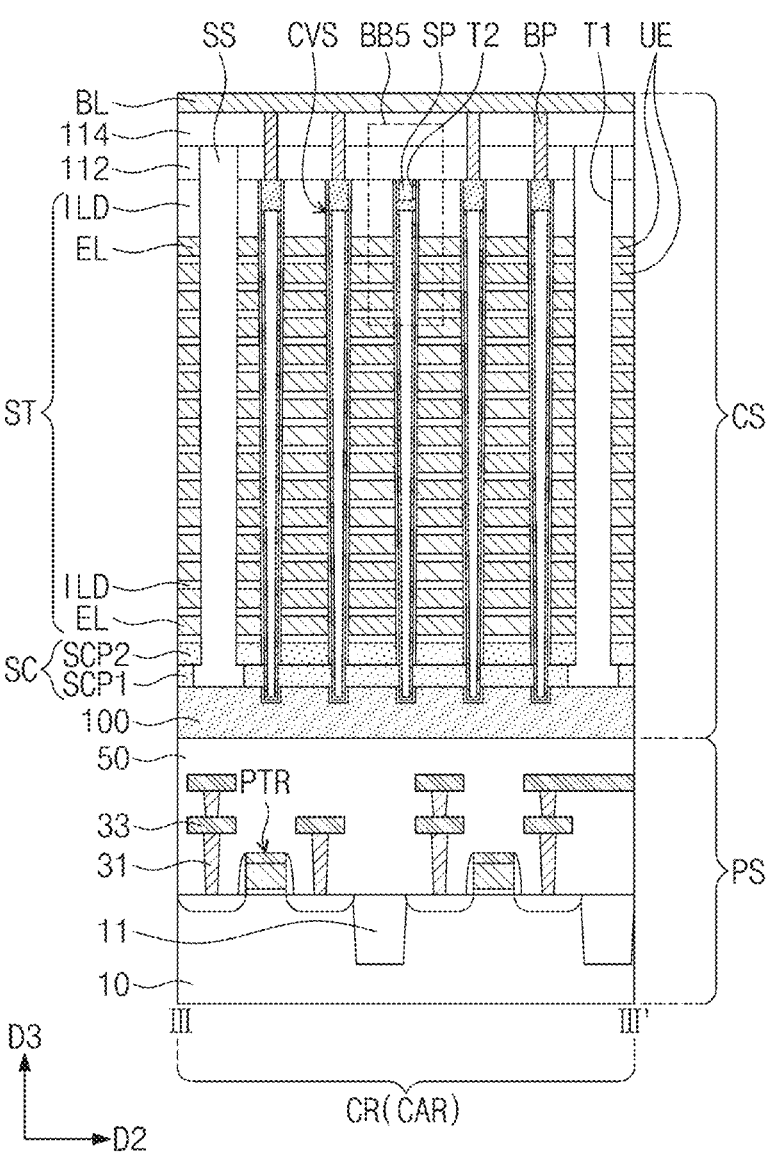
Figure 12C:
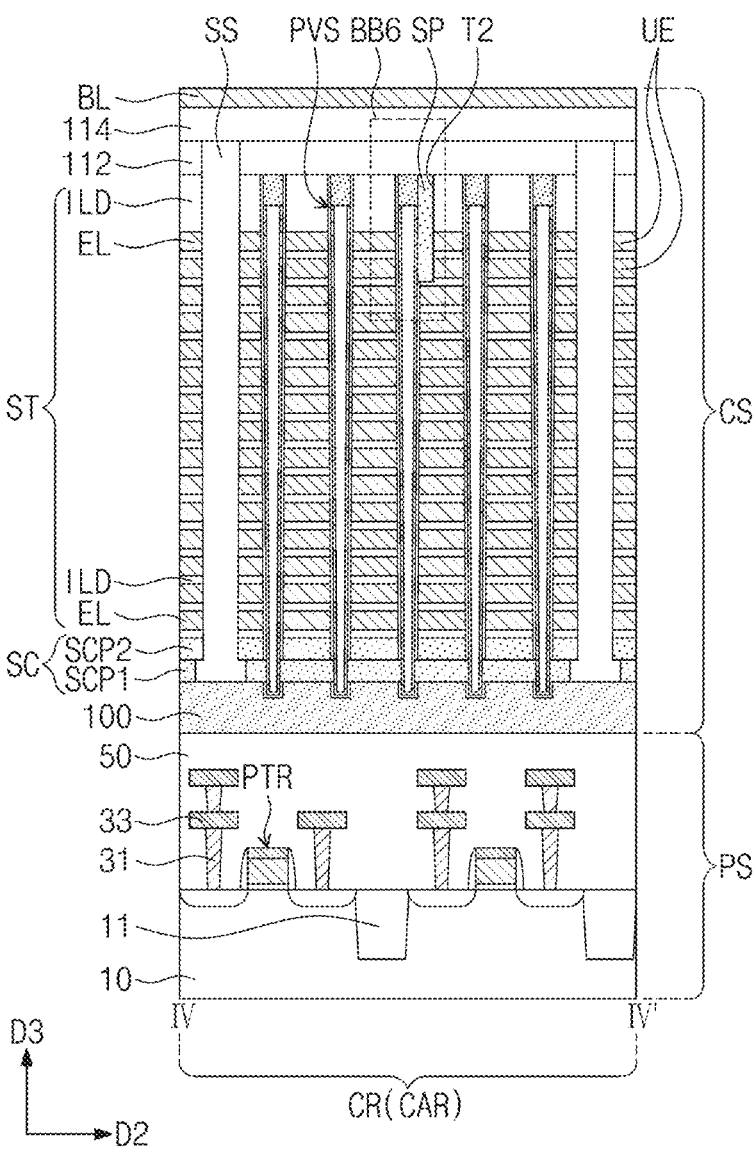
Figure 13:
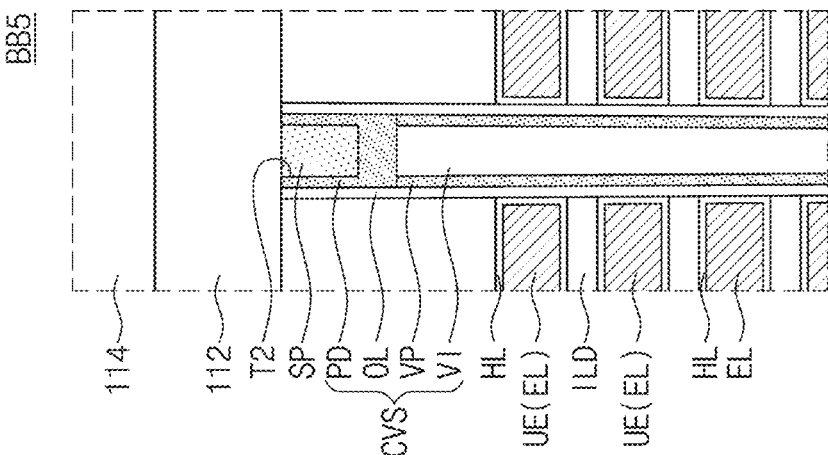
Figure 13:
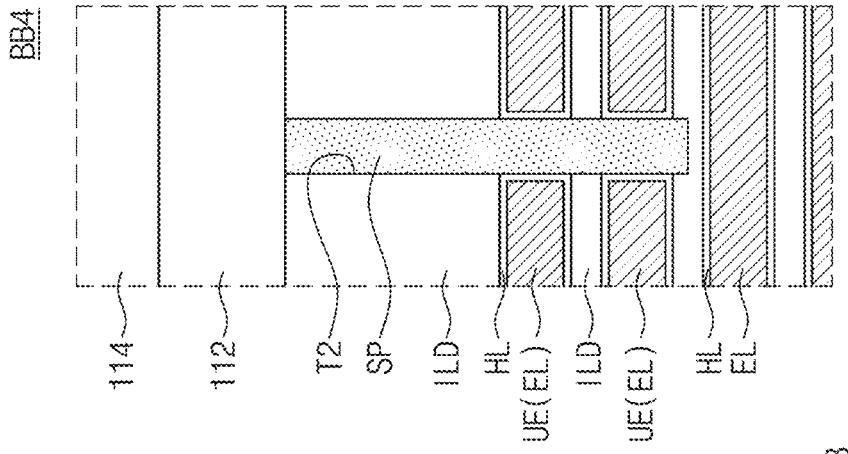

FIGS. 12A to 12C are sectional views, which are respectively taken along lines II-II', III-III', and IV-IV' of FIG. 6 to illustrate a portion of a semiconductor device according to some example embodiments of the inventive concepts. FIGS. 13 and 14 are enlarged sectional views illustrating a portion of a semiconductor device according to some embodiments of the inventive concepts and corresponding to portions BB4, BB5, and BB6 of FIG. 12A to 12C. For concise description, a previously described elements may be identified by the same reference numbers without repeating overlapping descriptions thereof.

Referring to FIGS. 12A to 12C and 13, the top surface of the separation insulating pattern SP may be located at the same level as the top surfaces of the vertical structures CVS and PVS. The separation insulating pattern SP may fill the trench T2, which is formed to extend from the top surface of the electrode structure ST toward the substrate 10. The top surface of the separation insulating pattern SP may be coplanar with the top surface of the uppermost one of the insulating patterns ILD of the electrode structure ST. The separation insulating pattern SP may include a portion which is inserted into the conductive pad PD. The bottom surface of the portion of the separation insulating pattern SP inserted into the conductive pad PD may be closer to the bottom surface of the conductive pad PD than to the top surface of the conductive pad PD.

Referring to FIGS. 12A to 12C and 14, the separation insulating pattern SP may be extended into a region between the electrode structure ST and the first interlayer insulating layer 112. The separation insulating pattern SP may cover a top surface of the electrode structure ST. For example, the separation insulating pattern SP may cover the top surface of the uppermost one of the insulating patterns ILD of the electrode structure ST.

Figure 15:
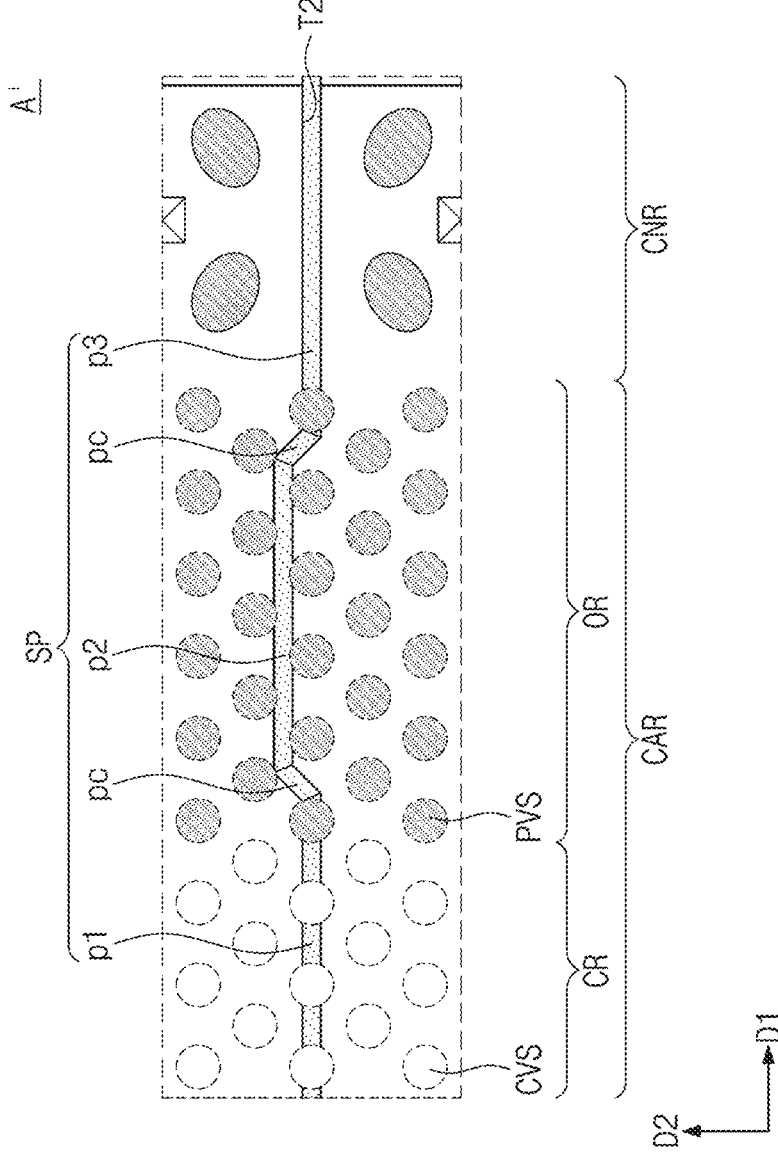
FIG. 15 is an enlarged plan view illustrating a portion of a semiconductor device according to an embodiment of the inventive concept and corresponding to a portion A of FIG. 5.
Figure 16:
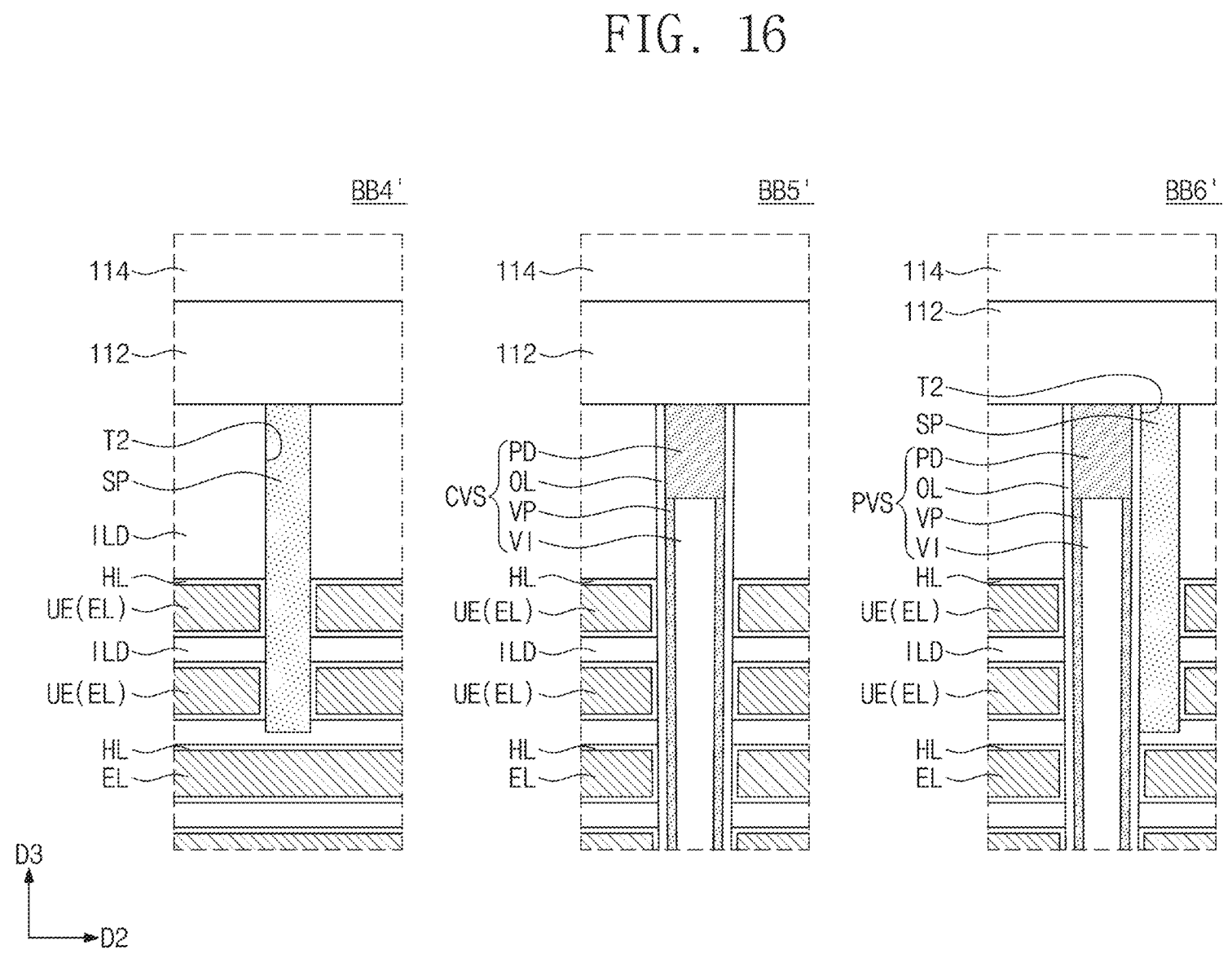

FIG. 15 is an enlarged plan view illustrating a portion of a semiconductor device according to some example embodiments of the inventive concepts and corresponding to a portion A of FIG. 5. FIG. 16 is an enlarged plan view illustrating a portion of a semiconductor device according to some example embodiments of the inventive concepts and corresponding to the portions BB1, BB2, and BB3 of FIG. 7B to 7D. Previously described elements may be identified by the same reference number without repeating an overlapping description thereof.

Referring to FIGS. 15 and 16, the separation insulating pattern SP may not be overlapped with the vertical structures CVS and PVS. The separation insulating pattern SP may be divided into a plurality of portions by the vertical structures CVS and PVS. The separation insulating pattern SP may not penetrate a portion of each of the vertical structures CVS and PVS. In some embodiments, the separation insulating pattern SP may be a pattern that is formed before the formation of the vertical structures CVS and PVS.

Figure 17:
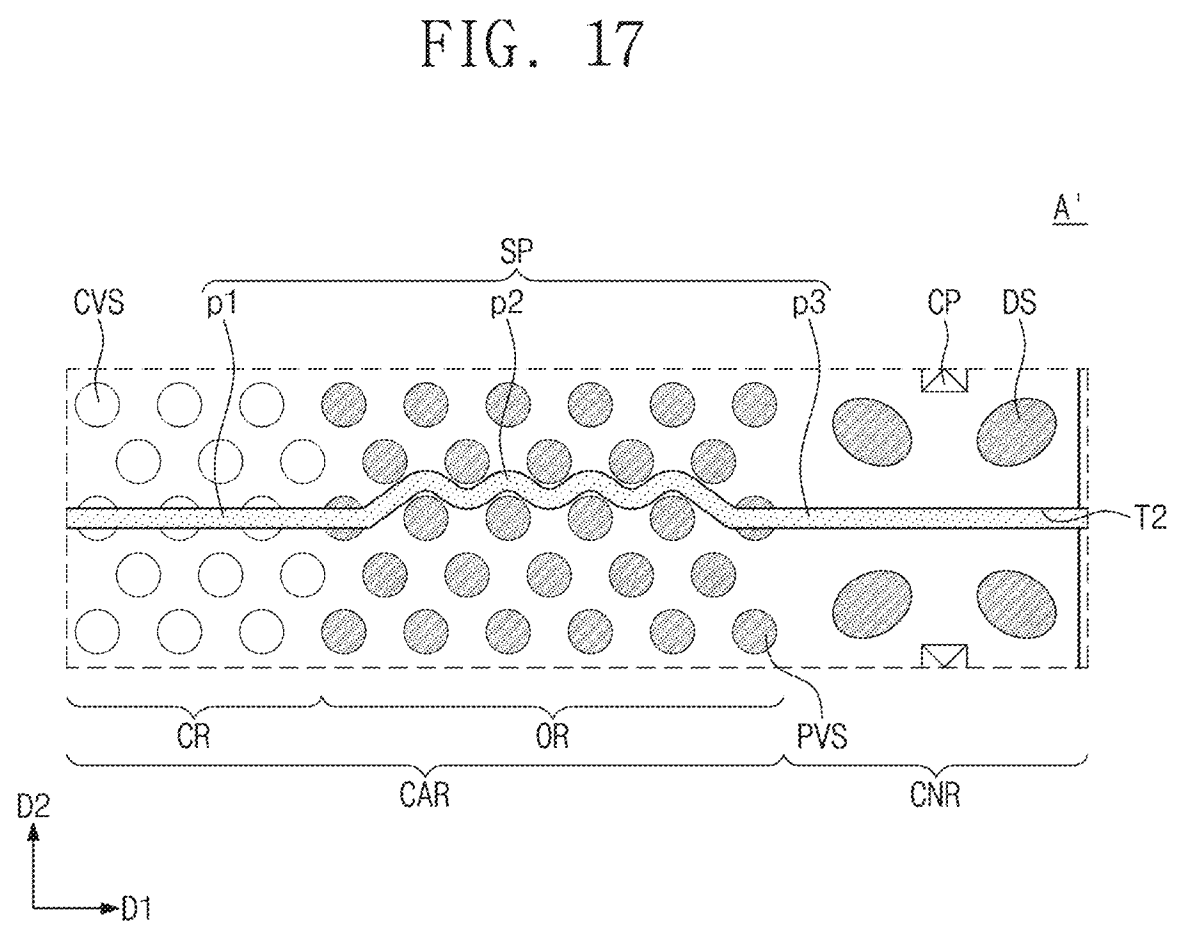

FIG. 17 is an enlarged plan view illustrating a portion of a semiconductor device according to some example embodiments of the inventive concepts and corresponding to the portion A of FIG. 5. For concise description, a previously described element may be identified by the same reference number without repeating an overlapping description thereof.

Referring to FIG. 17, the second portion p2 of the separation insulating pattern SP placed on the outer region OR may have a zigzag shape. The second portion p2 may be extended into a region between the peripheral vertical structures PVS and may not be vertically overlapped with the peripheral vertical structures PVS.

Figure 18:
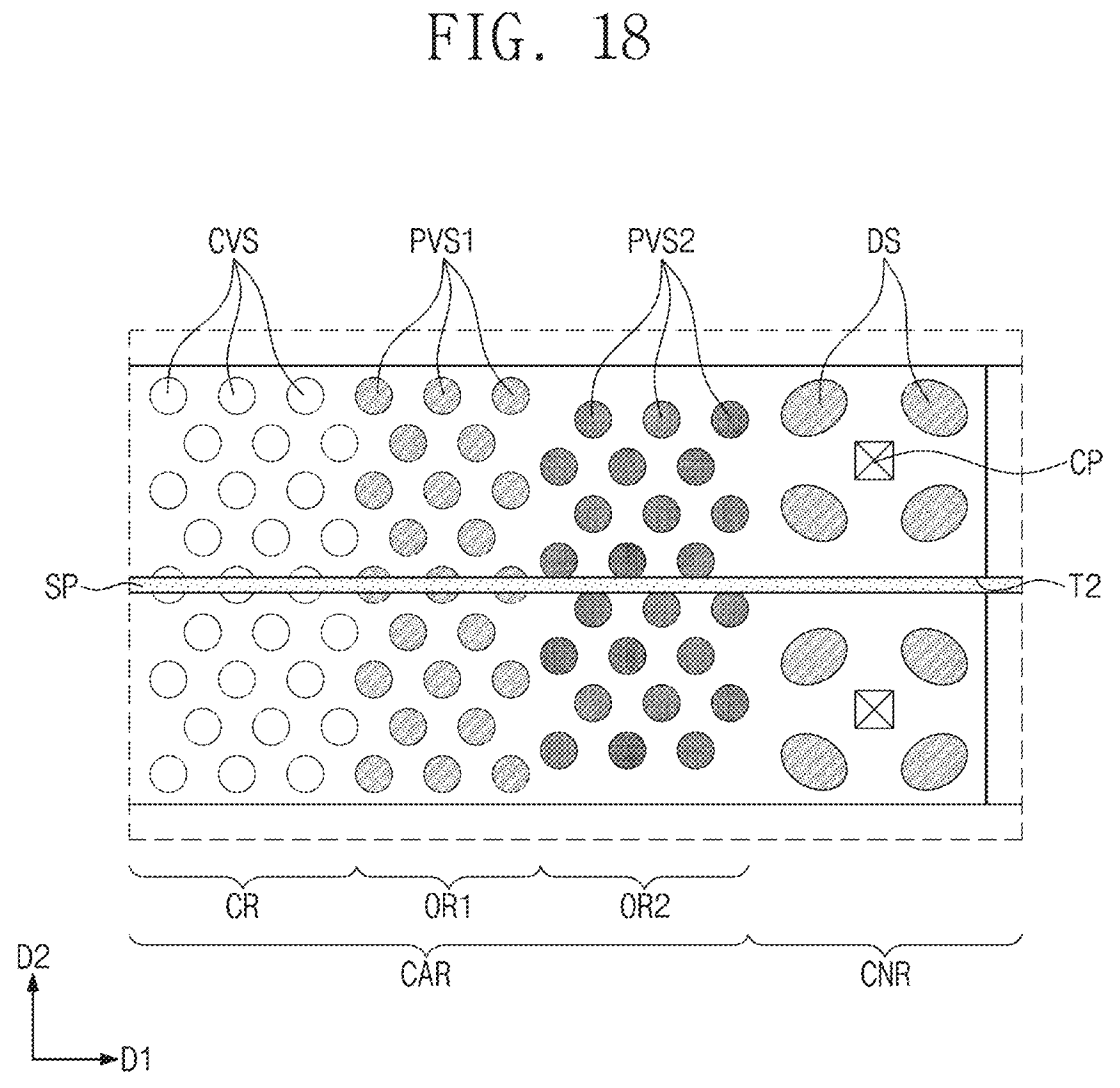
Figure 19:
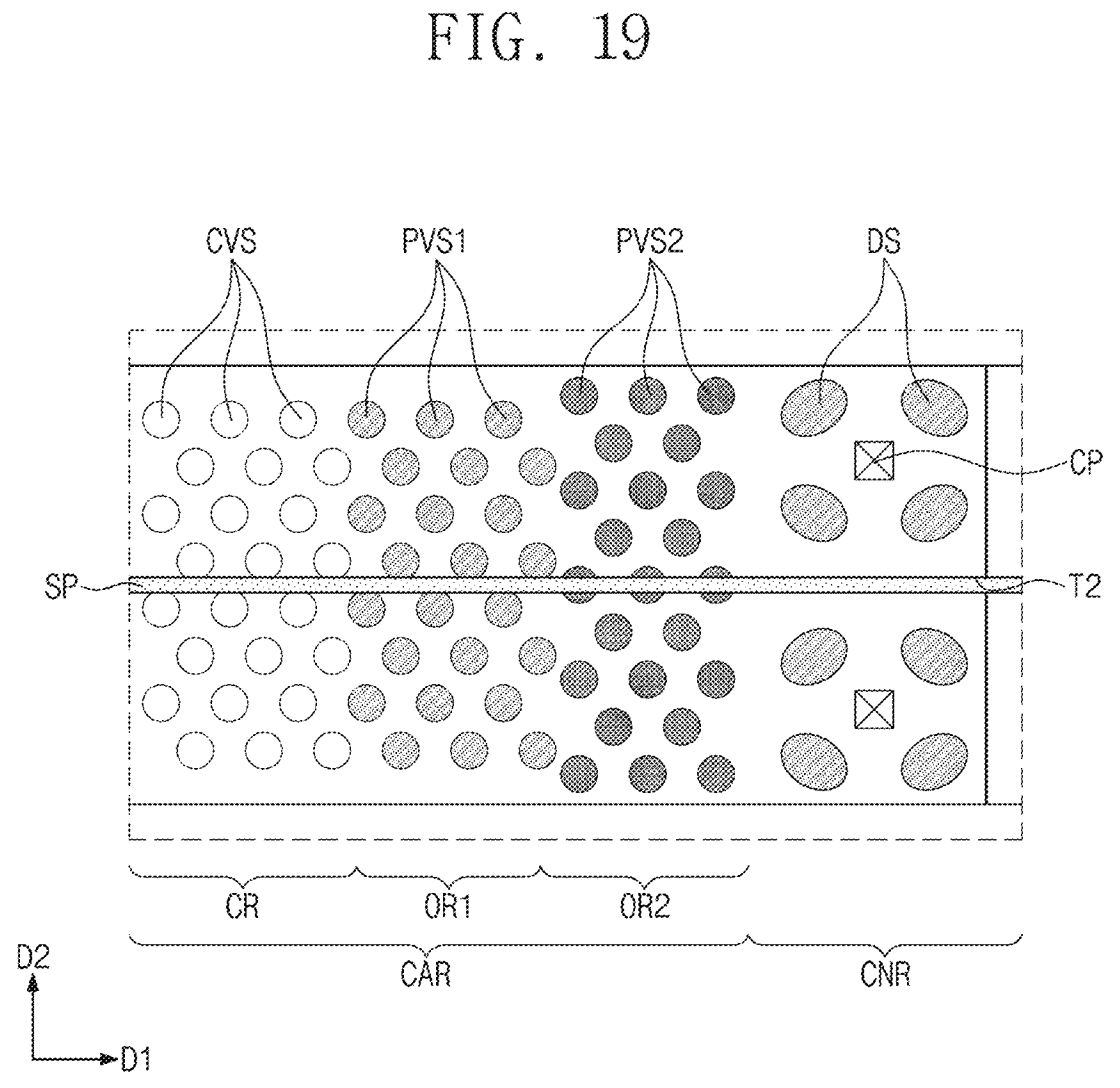

FIGS. 18 and 19 are enlarged plan views each illustrating a portion of semiconductor devices according to some example embodiments of the inventive concepts. For concise description, a previously described elements may be identified by the same reference numbers without repeating overlapping descriptions thereof.

Referring to FIG. 18, the cell array region CAR may have the center region CR, a first outer region OR1, and a second outer region OR2 arranged along the first direction D1. The first outer region OR1 may be located between the center region CR and the second outer region OR2. First peripheral vertical structures PVS1 may be provided on the first outer region OR1, and second peripheral vertical structures PVS2 may be provided on the second outer region OR2. The first peripheral vertical structures PVS1 and the second peripheral vertical structures PVS2 may be arranged in different shapes from each other. For example, the first peripheral vertical structures PVS1 on the first outer region OR1 may be arranged in a similar shape to the vertical structures VS described with reference to FIGS. 6 to 7D. In some embodiments, on the second outer region OR2, four second peripheral vertical structures PVS2 may be arranged in the second direction D2 to form a first column, and four second peripheral vertical structures PVS2 may be arranged in the second direction D2 to form a second column. The first and second columns may be arranged such that they are alternately repeated in the first direction D1.

On the center region CR and the first outer region OR1, the separation insulating pattern SP may be overlapped with centers of the central vertical structures CVS and centers of the first peripheral vertical structures PVS1. On the second outer region OR2, the separation insulating pattern SP may be spaced apart from centers of the second peripheral vertical structures PVS2. When viewed in a plan view, the separation insulating pattern SP may be a line-shaped pattern that is extended in the first direction D1.

Figure 7D:
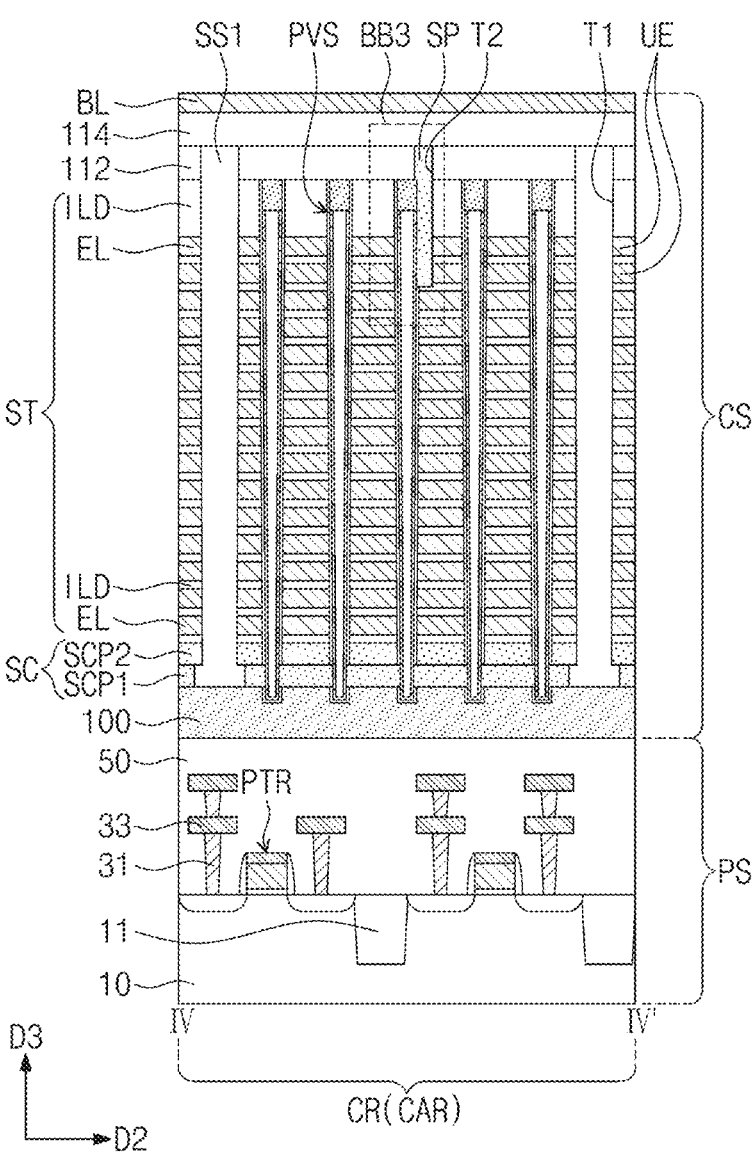

Referring to FIG. 19, the second peripheral vertical structures PVS2 on the second outer region OR2 may be arranged in a similar shape to the vertical structures VS described with reference to FIGS. 6 to 7D. On the center region CR, four central vertical structures CVS may be arranged in the second direction D2 to form a first column, and four central vertical structures CVS may be arranged in the second direction D2 to form a second column. On the first outer region OR1, four first peripheral vertical structures PVS1 may be arranged in the second direction D2 to form a first column, and four first peripheral vertical structures PVS1 may be arranged in the second direction D2 to form a second column.

On the center region CR and the first outer region OR1, the separation insulating pattern SP may not be overlapped with centers of the central vertical structures CVS and centers of the first peripheral vertical structures PVS1. On the second outer region OR2, the separation insulating pattern SP may be overlapped with centers of the second peripheral vertical structures PVS2.

FIGS. 20A to 20D are sectional views illustrating a method of fabricating a semiconductor device, according to some example embodiments of the inventive concepts.

Figure 20A:
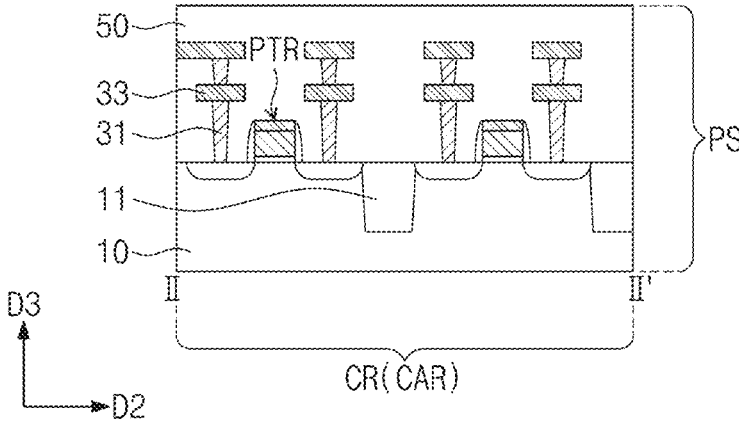
FIGS. 20A to 20D are sectional views illustrating a method of fabricating a semiconductor device, according to some example embodiments of the inventive concepts.

Referring to FIG. 20A, the peripheral circuit structure PS may be formed on the substrate 10. The formation of the peripheral circuit structure PS may include forming the peripheral transistors PTR on the substrate 10, forming the lower interconnection lines 33 and the peripheral contact 31 on the peripheral transistors PTR, and forming the lower insulating layer 50 on the substrate 10. The formation of the peripheral transistors PTR may include forming the device isolation layer 11 on the substrate 10 to define active regions, forming a gate insulating layer and gate electrodes on the active regions, and injecting impurities into the active regions to form source/drain region. The formation of the lower insulating layer 50 may include forming an insulating layer to cover the peripheral transistors PTR, the lower interconnection lines 33, and the peripheral contact 31 and planarizing a top surface of the insulating layer.

Figure 20B:
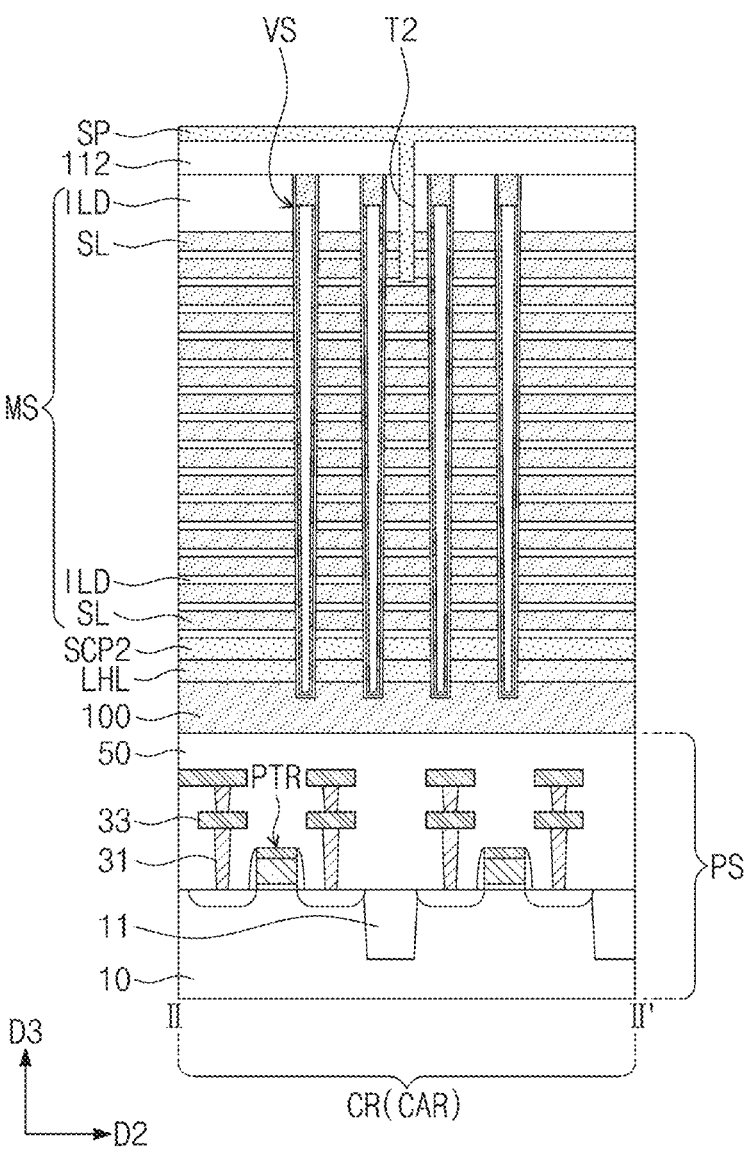

Referring to FIG. 20B, the lower semiconductor layer 100, a lower sacrificial layer LHL, and the second horizontal pattern SCP2 may be sequentially formed on the lower insulating layer 50. The lower sacrificial layer LHL may include a silicon nitride layer and/or a silicon oxynitride layer. A mold structure MS may be formed on the second horizontal pattern SCP2. The mold structure MS may include the insulating patterns ILD and sacrificial layers SL, which are alternately stacked. The sacrificial layers SL may be formed of and/or include a material having an etch selectivity with respect to the insulating patterns ILD. For example, the sacrificial layers SL may be formed of and/or include at least one of silicon nitride and/or silicon oxynitride.

Next, the vertical structures VS may be formed to penetrate the mold structure MS. Referring to FIGS. 10 and 20B, the formation of the vertical structures VS may include forming channel holes to penetrate the mold structure MS and sequentially forming the vertical insulating pattern OL, the vertical semiconductor pattern VP, and the gapfill insulating pattern VI in the channel holes. The conductive pad PD may be formed on the top surfaces of the gapfill insulating pattern VI and the vertical semiconductor pattern VP. The first interlayer insulating layer 112 may be formed on the mold structure MS to cover the vertical structures VS.

Figure 20C:
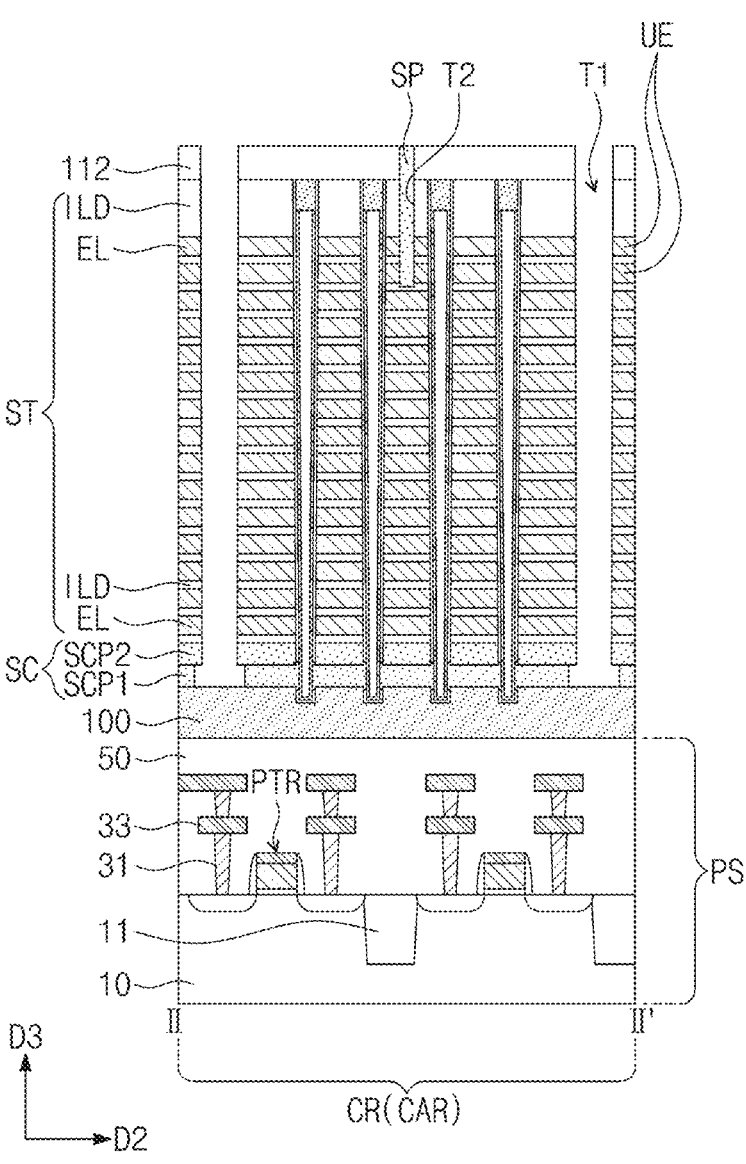

A patterning process may be performed on the first interlayer insulating layer 112 to form the trench T2. The trench T2 may be formed to extend from the top surface of the first interlayer insulating layer 112 toward the substrate 10. The trench T2 may be formed to penetrate the insulating patterns ILD and some of the sacrificial layers SL. The separation insulating pattern SP may be formed to fill the trench T2. The formation of the separation insulating pattern SP may include performing a deposition process to form an insulating layer on the first interlayer insulating layer 112. Thereafter, in some embodiments, a planarization process may be performed to expose the top surface of the first interlayer insulating layer 112, as shown in FIG. 20C. A portion of the insulating layer, which is formed on the top surface of the first interlayer insulating layer 112, may be removed by the planarization process.

In some embodiments, the separation insulating pattern SP may be formed before the formation of the first interlayer insulating layer 112. The top surface of the separation insulating pattern SP may be located at the same vertical level as the top surfaces of the vertical structures VS, as shown in FIG. 13. In some embodiment, as shown in FIG. 14, the planarization process on the insulating layer filling the trench T2 may be omitted, and in this case, the separation insulating pattern SP may be formed to have the shape of the letter 'T'.

Referring to FIGS. 20B and 20C, the electrode structure ST may be formed. The formation of the electrode structure ST may include removing the sacrificial layers SL to form empty spaces and forming the electrodes EL in the empty spaces. The removal of the sacrificial layers SL may include forming separation trenches T1 to expose side surfaces of the sacrificial layers SL and selectively etching the sacrificial layers SL.

Figure 20D:
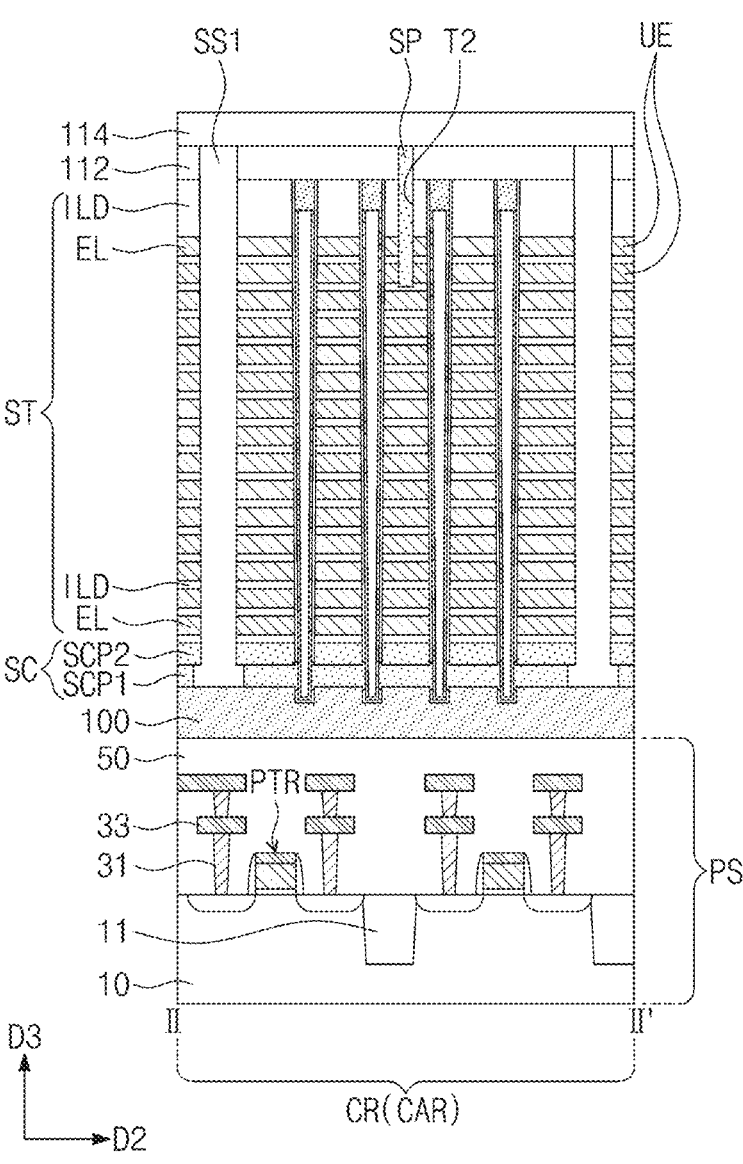

Referring to FIGS. 20C and 20D, the separation structure SS1 may be formed to fill the separation trench T1. The second interlayer insulating layer 114 may be formed to cover the separation structure SS1.

Referring back to FIGS. 7A to 7D, the bit lines BL and the upper interconnection lines CL may be formed on the second interlayer insulating layer 114. The bit line contacts BP may be formed to connect the bit lines BL to some of the central vertical structures CVS. The cell contact plugs CP may be formed to connect the upper interconnection lines CL to the electrodes EL.

Figure 21:
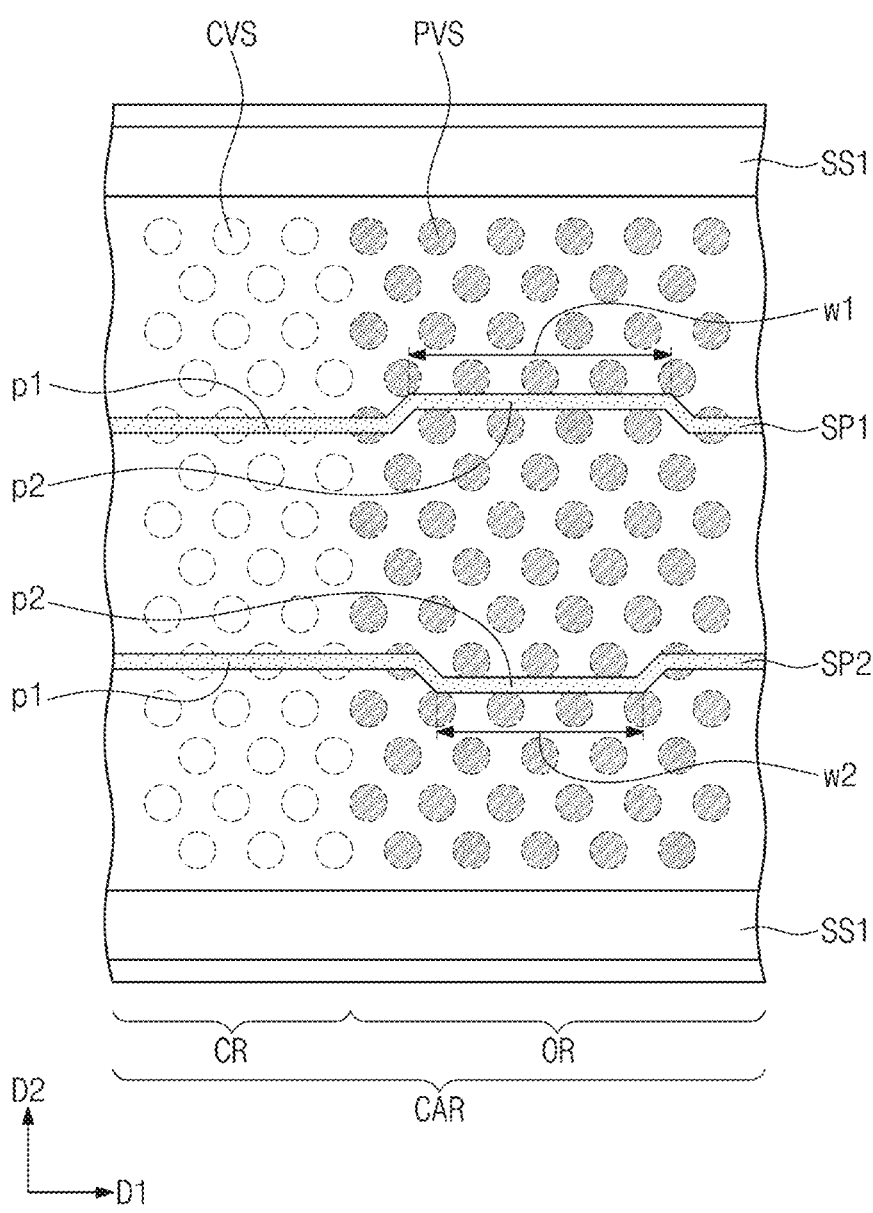
FIG. 21 is a plan view illustrating a cell array region of a semiconductor device according to some example embodiments of the inventive concepts.

FIG. 21 is a plan view illustrating a cell array region of a semiconductor device according to some embodiments of the inventive concepts. For concise description, a previously described elements may be identified by the same reference numbers without repeating an overlapping description thereof.

Referring to FIG. 21, a first separation insulating pattern SP1 and a second separation insulating pattern SP2 may be provided on the electrode structure ST. Each electrode of the electrode structure ST may be divided into three portions, which are electrically disconnected from each other, by the first and second separation insulating patterns SP1 and SP2. The first and second separation insulating patterns SP1 and SP2 may be spaced apart from each other in the second direction D2. Each of the first and second separation insulating patterns SP1 and SP2 may have the first portion p1 on the center region CR and the second portion p2 on the outer region OR. The first portions p1 and the second portions p2 may be linear portions that are extended in the first direction D1. A length w1 of the second portion p2 of the first separation insulating pattern SP1 in the first direction D1 may be larger than a length w2 of the second portion p2 of the second separation insulating pattern SP2 in the first direction D1.

In some embodiments, seven vertical structures VS may be arranged in the second direction D2 to form a first column, and seven vertical structures VS may be arranged in the second direction D2 to form a second column. The first and second columns may be arranged such that they are alternately repeated in the first direction D1.

Figure 22:
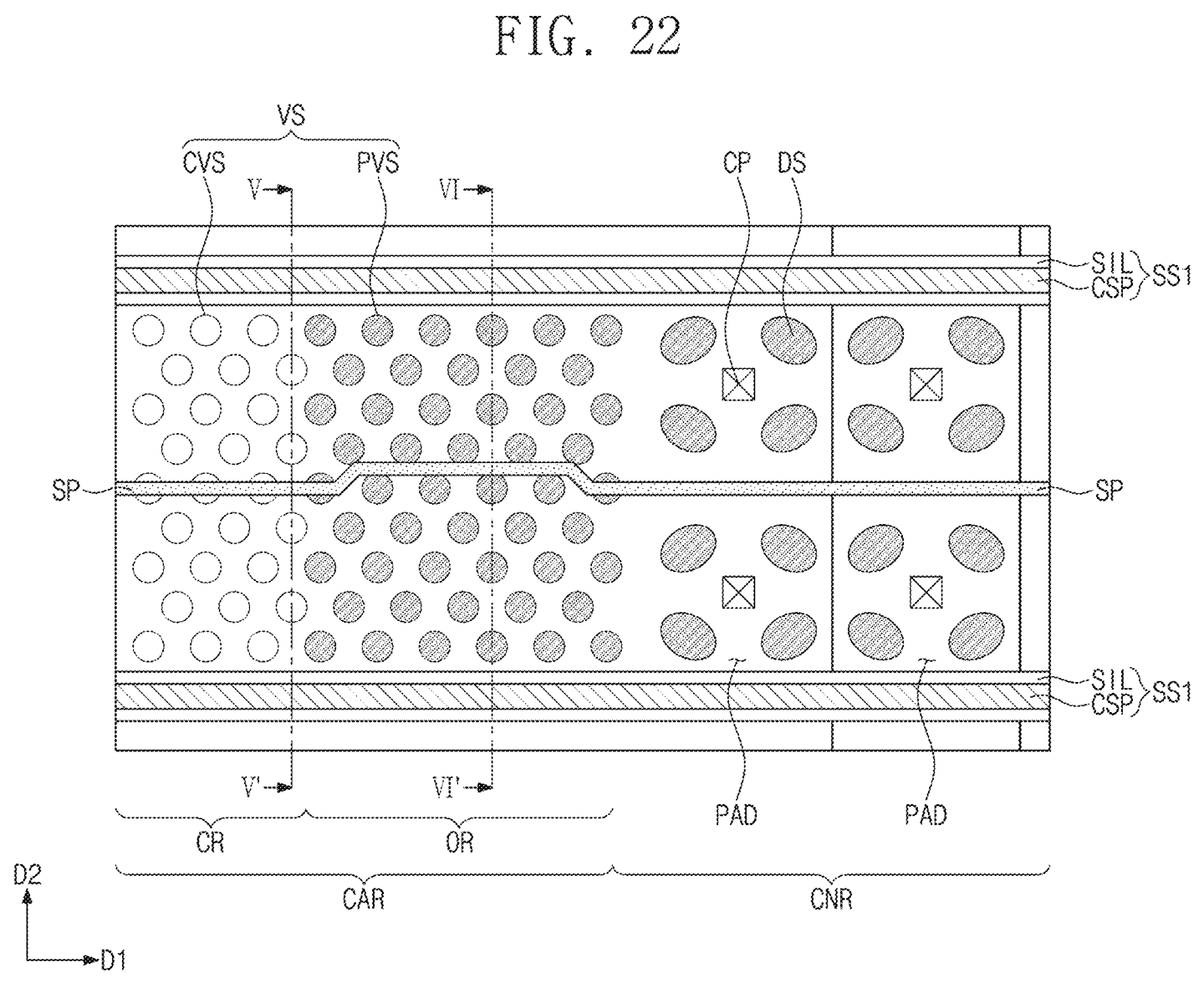
Figure 23A:
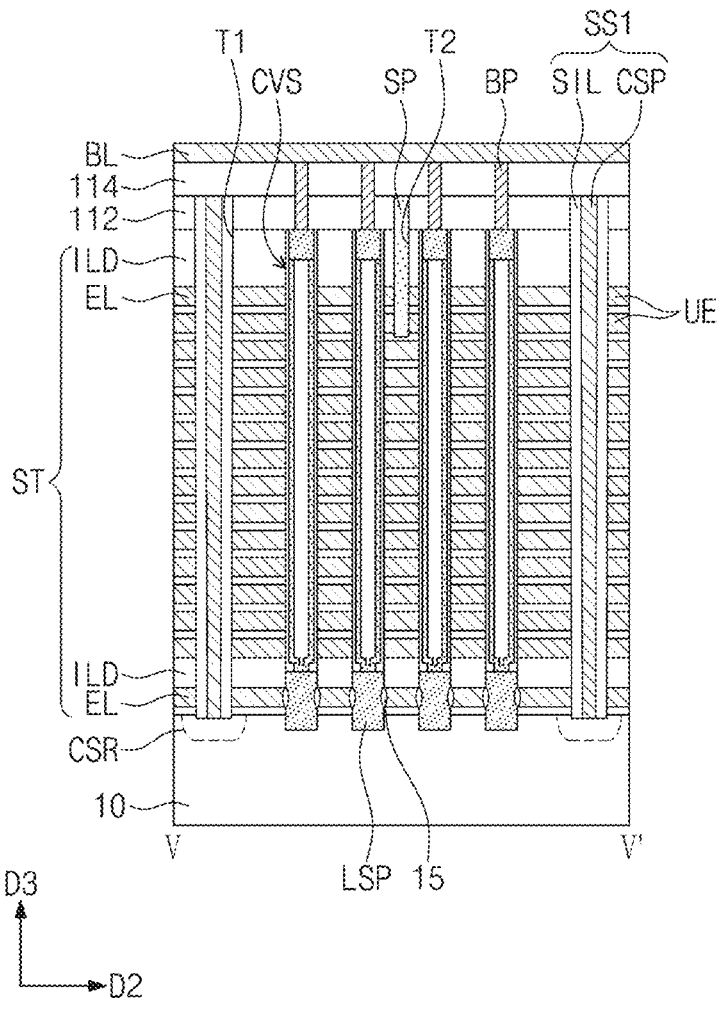
FIGS. 23A and 23B are sectional views taken along lines V-V' and VI-VI' of FIG. 22.
Figure 23B:
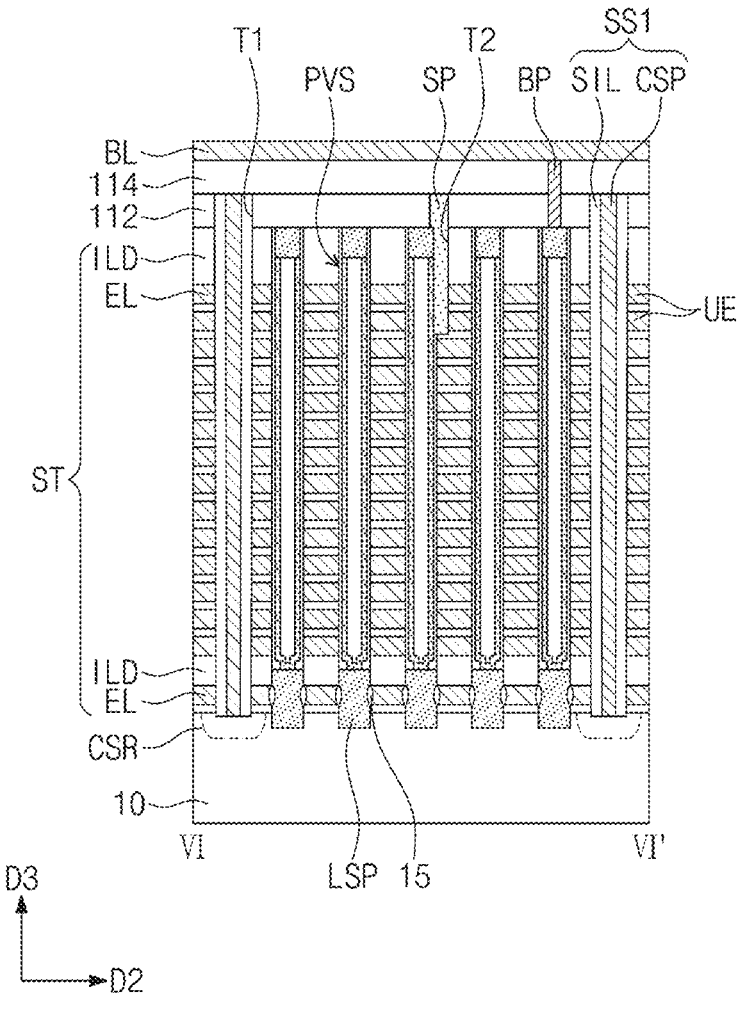

FIG. 22 is a plan view illustrating a semiconductor device according to some example embodiments of the inventive concepts. FIGS. 23A and 23B are sectional views taken along lines V-V' and VI-VI' of FIG. 22.

Referring to FIGS. 22 to 23B, the electrode structure ST may be directly formed on the substrate 10. For example, the peripheral circuit structure PS (e.g., see FIG. 7B) may not be provided between the electrode structure ST and the substrate 10.

The vertical structures VS may include lower semiconductor patterns LSP. The lower semiconductor pattern LSP may be in direct contact with the substrate 10 and may include a pillar-shaped epitaxial layer grown from the substrate 10. The lower semiconductor pattern LSP may be formed of silicon (Si), but in some embodiments, the lower semiconductor pattern LSP may include at least one of germanium (Ge), silicon-germanium (SiGe), III-V semiconductor compounds, II-VI semiconductor compounds, and/or the like. A gate insulating layer 15 may be provided on a portion of the side surface of the lower semiconductor pattern LSP. The gate insulating layer 15 may be disposed between the lowermost electrode EL and the lower semiconductor pattern LSP. The gate insulating layer 15 may include a silicon oxide layer (e.g., a thermal oxide layer). The gate insulating layer 15 may have a rounded side surface.

Common source regions CSR may be provided in an upper portion of the substrate 10. The common source regions CSR may be an impurity-doped region and may have a higher doping concentration than the substrate 10. The common source regions CSR may be extended parallel to the electrode structures ST or in the first direction D1. In an embodiment, the common source regions CSR may contain n-type impurities (e.g., arsenic (As) or phosphorus (P)). The separation structure SS1 may include a common source plug CSP and a sidewall insulating pattern SIL. The common source plug CSP may be coupled to the common source region CSR.

Figure 24:
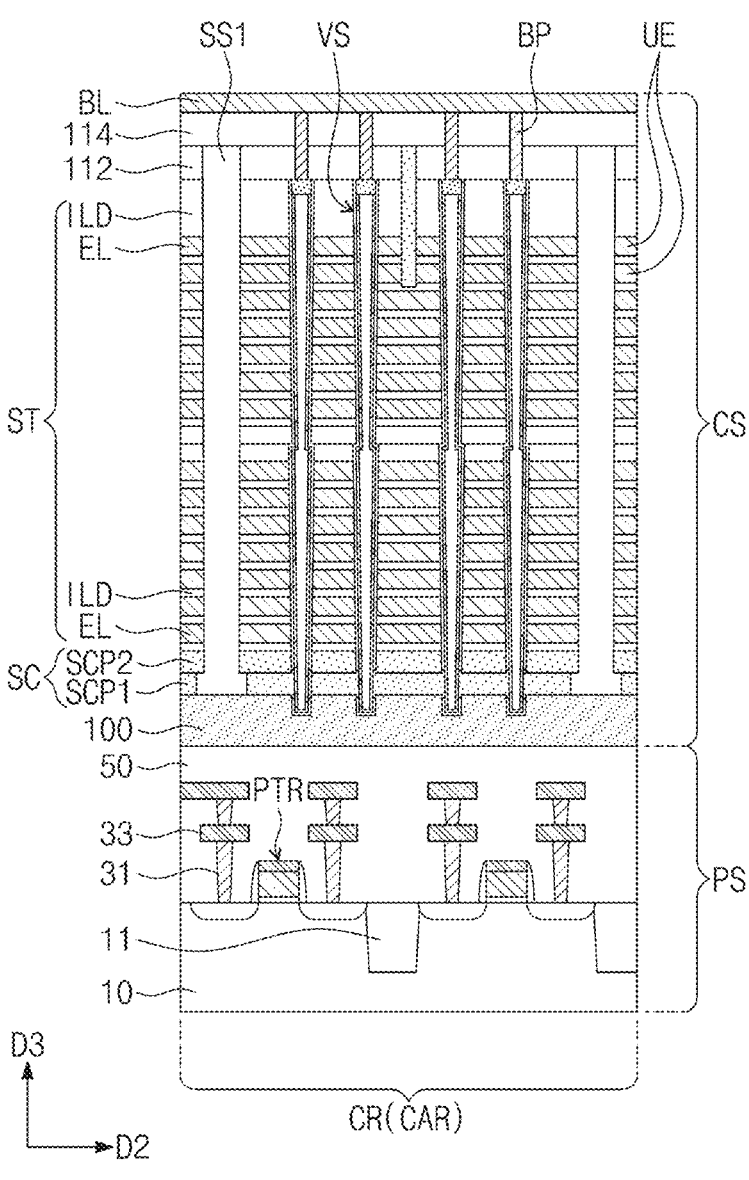
FIGS. 24 and 25 are sectional views illustrating a semiconductor device according to some example embodiments of the inventive concepts.
Figure 25:
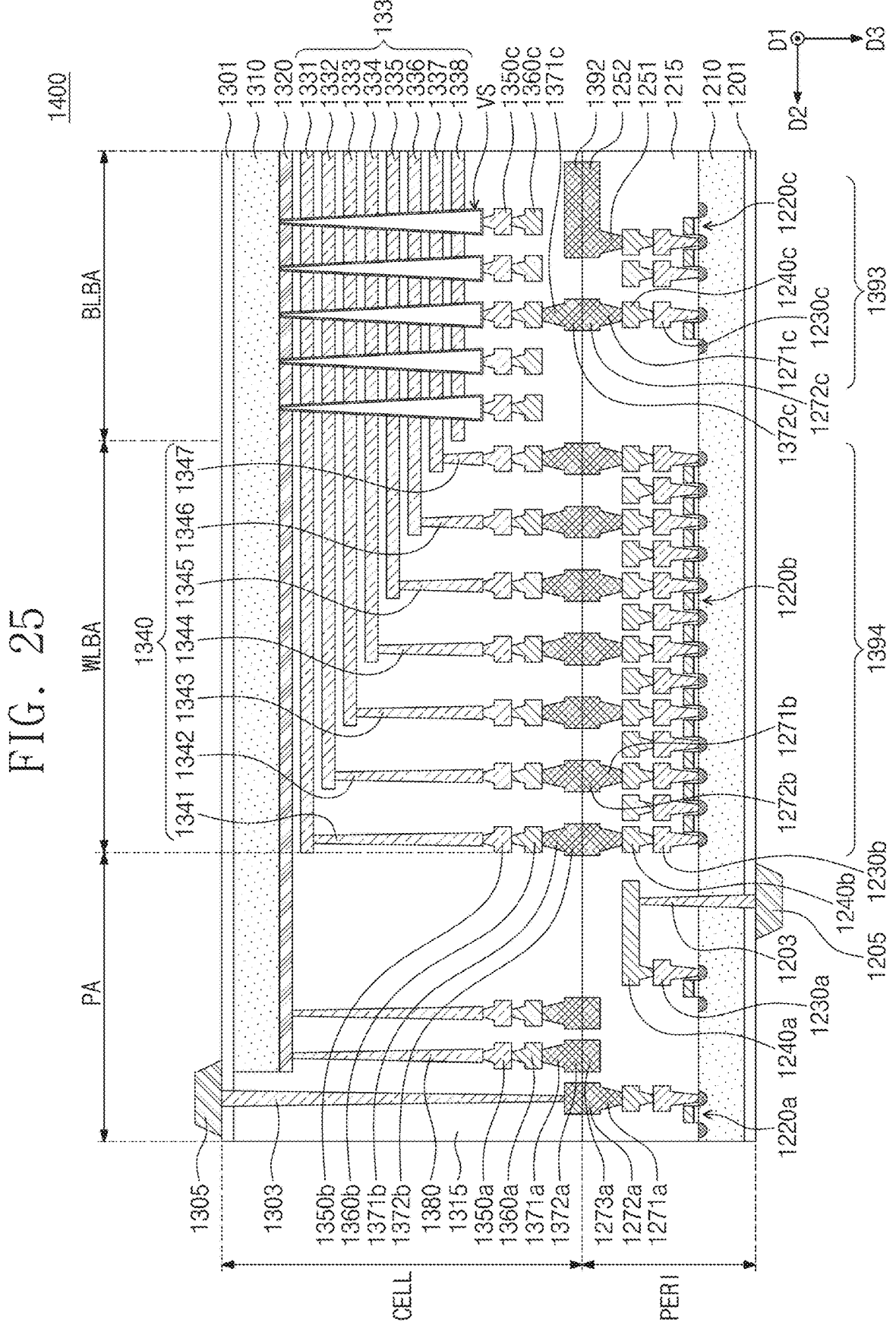

FIGS. 24 and 25 are sectional views illustrating semiconductor devices according to some example embodiments of the inventive concepts.

Referring to FIG. 24, each of the vertical structures VS may include a staircase portion having a discontinuously varying diameter. For example, the vertical structure VS may be provided in a lower channel hole and an upper channel hole, which are formed to be vertically overlapped with each other. The upper channel hole may have a gradually decreasing distance, with decreasing distance to the lower channel hole. An upper portion of the lower channel hole may have a diameter smaller than a lower portion of the upper channel hole. The staircase portion of the vertical structure VS may be placed near a boundary between the upper channel hole and the lower channel hole.

Referring to FIG. 25, a memory device 1400 may be provided to have a chip-to-chip (C2C) structure. For the C2C structure, an upper chip including a cell array structure CELL may be fabricated on a first wafer, a lower chip including a peripheral circuit structure PERI may be fabricated on a second wafer different from the first wafer, and the upper chip and the lower chip may be connected to each other through a bonding method. The bonding method may mean a method of electrically connecting a bonding metal formed in the uppermost metal layer of the upper chip to a bonding metal formed in the uppermost metal layer of the lower chip. For example, in the case where the bonding metal is formed of copper (Cu), the bonding method may be a Cu-to-Cu bonding method, but in some embodiments, aluminum (Al) or tungsten (W) may be used as the bonding metal.

Each of the peripheral circuit structure PERI and the cell array structure CELL of the memory device 1400 may include an outer pad bonding region PA, a word line bonding region WLBA, and a bit line bonding region BLBA.

The peripheral circuit structure PERI may include a first substrate 1210, an interlayer insulating layer 1215, a plurality of circuit devices 1220a, 1220b, and 1220c formed on the first substrate 1210, first metal layers 1230a, 1230b, and 1230c connected to the circuit devices 1220a, 1220b, and 1220c, respectively, and second metal layers 1240a, 1240b, and 1240c formed on the first metal layers 1230a, 1230b, and 1230c. In an embodiment, the first metal layers 1230a, 1230b, and 1230c may be formed of and/or include a conductive material (e.g., tungsten) having relatively high electric resistivity, and the second metal layers 1240a, 1240b, and 1240c may be formed of and/or include a conductive material (e.g., copper) having relatively low electric resistivity.

Although only the first metal layers 1230a, 1230b, and 1230c and the second metal layers 1240a, 1240b, and 1240c are illustrated and described in the present specification, the inventive concepts are not limited thereto and at least one metal layer may be further formed on the second metal layers 1240a, 1240b, and 1240c. At least one of the additional metal layers, which are formed on the second metal layers 1240a, 1240b, and 1240c, may be formed of a material which has lower electric resistivity than the material of the second metal layers 1240a, 1240b, and 1240c.

The interlayer insulating layer 1215 may be disposed on the first substrate 1210 to cover the circuit devices 1220a, 1220b, and 1220c, the first metal layers 1230a, 1230b, and 1230c, and the second metal layers 1240a, 1240b, and 1240c and may be formed of or include at least one of insulating materials (e.g., silicon oxide and silicon nitride).

Lower bonding metals 1271b and 1272b may be formed on the second metal layer 1240b of the word line bonding region WLBA. The word line bonding region WLBA may correspond to the connection region CNR described with reference to FIG. 5. In the word line bonding region WLBA, the lower bonding metals 1271b and 1272b of the peripheral circuit structure PERI may be electrically connected to upper bonding metals 1371b and 1372b of the cell array structure CELL through a bonding method, and the lower bonding metals 1271b and 1272b and the upper bonding metals 1371b and 1372b may be formed of or include at least one of aluminum, copper, or tungsten.

The cell array structure CELL may include at least one memory block. The cell array structure CELL may include a second substrate 1310 and a common source line 1320. A plurality of electrodes 1331-1338 or 1330 may be stacked on the second substrate 1310 in a direction that is perpendicular to a top surface of the second substrate 1310. In the bit line bonding region BLBA, a channel structure CH may be extended in the direction perpendicular to the top surface of the second substrate 1310 to penetrate the electrodes 1330. The vertical structure VS may include a data storage layer, a channel layer, an insulating gapfill layer, or the like, and in this case, the channel layer may be electrically connected to a first metal layer 1350c and a second metal layer 1360c. For example, the first metal layer 1350c may be a bit line contact, and the second metal layer 1360c may be a bit line.

A region, in which the vertical structure VS and the bit line 1360c are disposed, may be defined as the bit line bonding region BLBA and may correspond to the cell array region CAR described with reference to FIG. 5. The bit line 1360c may be electrically connected to the circuit devices 1220c, which are provided in the peripheral circuit structure PERI adjacent to the bit line bonding region BLBA to constitute a page buffer 1393. As an example, the bit lines 1360c may be connected to the peripheral circuit structure PERI through upper bonding metals 1371c and 1372c, and the upper bonding metals 1371c and 1372c may be connected to lower bonding metals 1271c and 1272c, which are connected to the circuit devices 1220c of the page buffer 1393.

In the word line bonding region WLBA, the electrodes 1330 may be extended in a second direction D2, which is parallel to the top surface of the second substrate 1310, and may be connected to a plurality of cell contact plugs 1341-1347 or 1340. The cell contact plugs 1340 may be connected to pads of the electrodes 1330, which are extended to have different lengths from each other in the second direction D2. A first metal layer 1350b and a second metal layer 1360b may be provided on each of the cell contact plugs 1340, which are connected to the electrodes 1330. In the word line bonding region WLBA, the cell contact plugs 1340 may be connected to the peripheral circuit structure PERI through the upper bonding metals 1371b and 1372b of the cell array structure CELL and the lower bonding metals 1271b and 1272b of the peripheral circuit structure PERI.

In the peripheral circuit structure PERI, the cell contact plugs 1340 may be electrically connected to the circuit devices 1220b constituting a row decoder 1394. In an embodiment, an operation voltage of the circuit devices 1220b constituting the row decoder 1394 may be different from an operation voltage of the circuit devices 1220c constituting the page buffer 1393. As an example, the operation voltage of the circuit devices 1220c constituting the page buffer 1393 may be higher than the operation voltage of the circuit devices 1220*b* constituting the row decoder 1394.

A common source line contact plug 1380 may be disposed in the outer pad bonding region PA. The common source line contact plug 1380 may be formed of a conductive material (e.g., metals, metal compounds, and/or polysilicon) and may be electrically connected to the common source line 1320. A first metal layer 1350*a* and a second metal layer 1360*a* may be sequentially stacked on the common source line contact plug 1380. A region, in which the common source line contact plug 1380, the first metal layer 1350*a*, and the second metal layer 1360*a* are provided, may be defined as the outer pad bonding region PA.

Input/output pads 1205 and 1305 may be disposed in the outer pad bonding region PA. A lower insulating layer 1201 may be formed below the first substrate 1210 to cover the bottom surface of the first substrate 1210, and a first input/output pad 1205 may be formed on the lower insulating layer 1201. The first input/output pad 1205 may be connected to at least one of the circuit devices 1220*a*, 1220*b*, and 1220*c* of the peripheral circuit structure PERI through a first input/output contact plug 1203 and may be separated from the first substrate 1210 by the lower insulating layer 1201. In addition, a sidewall insulating layer (not shown) may be disposed between the first input/output contact plug 1203 and the first substrate 1210 to electrically separate the first input/output contact plug 1203 from the first substrate 1210.

An upper insulating layer 1301 may be formed on the second substrate 1310 to cover the top surface of the second substrate 1310, and a second input/output pad 1305 may be disposed on the upper insulating layer 1301. The second input/output pad 1305 may be connected to at least one of the circuit devices 1220*a*, 1220*b*, and 1220*c* of the peripheral circuit structure PERI through a second input/output contact plug 1303. For example, the second input/output pad 1305 may be electrically connected to the circuit device 1220*a*.

In some embodiments, the second substrate 1310 and the common source line 1320 may not be disposed in a region provided with the second input/output contact plug 1303. Furthermore, the second input/output pad 1305 may not be overlapped with the electrodes 1330 in the third direction D3. The second input/output contact plug 1303 may be separated from the second substrate 1310 in a direction parallel to the top surface of the second substrate 1310, may penetrate an interlayer insulating layer 1315 of the cell array structure CELL, and may be connected to the second input/output pad 1305.

In some embodiments, the first input/output pad 1205 and the second input/output pad 1305 may be selectively formed. As an example, the memory device 1400 may be configured to include only the first input/output pad 1205, which is provided on the first substrate 1210, or to include only the second input/output pad 1305, which is provided on the second substrate 1310. Alternatively, the memory device 1400 may be configured to include both of the first and second input/output pads 1205 and 1305.

A metal pattern, which is used as a dummy pattern, may be provided in the uppermost metal layer of the outer pad bonding region PA and the bit line bonding region BLBA, which are included in each of the cell array structure CELL and the peripheral circuit structure PERI, but in an embodiment, such a metal pattern may not be provided.

The memory device 1400 may include an upper metal pattern 1372*a* and a lower metal pattern 1273*a*, which are provided in the outer pad bonding region PA, and here, the lower metal pattern 1273*a* may be formed in the uppermost metal layer of the peripheral circuit structure PERI to correspond to the upper metal pattern 1372*a*, which is formed in the uppermost metal layer of the cell array structure CELL, and may have the same shape as the upper metal pattern 1372*a* of the cell array structure CELL. The lower metal pattern 1273*a*, which is formed in the uppermost metal layer of the peripheral circuit structure PERI, may not be connected to any contact plug, in the peripheral circuit structure PERI. Similarly, in the outer pad bonding region PA, the upper metal pattern 1372*a* may be formed in the uppermost metal layer of the cell array structure CELL to correspond to the lower metal pattern 1273*a*, which is formed in the uppermost metal layer of the peripheral circuit structure PERI, and in this case, the upper metal pattern 1372*a* may have the same shape as the lower metal pattern 1273*a* of the peripheral circuit structure PERI.

The lower bonding metals 1271*b* and 1272*b* may be formed on the second metal layer 1240*b* of the word line bonding region WLBA. In the word line bonding region WLBA, the lower bonding metals 1271*b* and 1272*b* of the peripheral circuit structure PERI may be electrically connected to the upper bonding metals 1371*b* and 1372*b* of the cell array structure CELL through a bonding method.

Furthermore, in the bit line bonding region BLBA, an upper metal pattern 1392 may be formed in the uppermost metal layer of the cell array structure CELL to correspond to a lower metal pattern 1252, which is formed in the uppermost metal layer of the peripheral circuit structure PERI, and in this case, the upper metal pattern 1392 may have the same shape as the lower metal pattern 1252 of the peripheral circuit structure PERI. In some embodiments, any contact plug may not be formed on the upper metal pattern 1392, which is formed in the uppermost metal layer of the cell array structure CELL.

According to some example embodiments of the inventive concepts, it may be possible to realize a semiconductor device with improved reliability and an increased density and an electronic system including the same.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate including a cell array region and a connection region arranged along a first direction, the cell array region comprising a center region and an outer region arranged along the first direction, the outer region of the cell array region disposed between the center region of the cell array region and the connection region along the first direction;
   an electrode structure including a plurality of electrodes and a plurality of pads, the plurality of electrodes vertically stacked on the substrate and spaced apart from each other in a vertical direction perpendicular to the first direction, the plurality of pads disposed over the connection region;
   a plurality of vertical structures in the cell array region extending through the electrode structure in the vertical direction, the plurality of vertical structures comprising:
      a plurality of central vertical structures disposed in the center region of the cell array region, and
      a plurality of peripheral vertical structures disposed in the outer region of the cell array region;

a plurality of vertical supporting structures in the connection region extending through the plurality of pads; and a separation insulating pattern extending through an upper electrode of the plurality of electrodes, the separation insulating pattern dividing the upper electrode into at least two portions in a second direction perpendicular to the first direction and the vertical direction, wherein the at least two portions are electrically isolated from each other, wherein the plurality of central vertical structures comprises a first vertical structure, which overlaps with the separation insulating pattern, the plurality of peripheral vertical structures comprises a second vertical structure, which overlaps with the separation insulating pattern, and when viewed on a plane perpendicular to the vertical direction, an overlapping area between the first vertical structure and the separation insulating pattern is larger than an overlapping area between the second vertical structure and the separation insulating pattern, and wherein, when viewed on the plane perpendicular to the vertical direction, a center of the second vertical structure of the plurality of peripheral vertical structures is spaced apart from the separation insulating pattern.

2. The semiconductor device of claim 1, further comprising:

bit lines on the cell array region and extended in a second direction which crosses the first direction, and wherein the plurality of peripheral vertical structures are electrically isolated from the bit lines.

3. The semiconductor device of claim 1, wherein the first vertical structure and the second vertical structure have a same width in the first direction.

4. The semiconductor device of claim 1, further comprising:

an electrode barrier layer between the separation insulating pattern and the upper electrode.

5. The semiconductor device of claim 1, wherein a vertical supporting structure of the plurality of vertical supporting structures has a width larger than a width of a vertical structure of the plurality of vertical structures.

6. The semiconductor device of claim 1, wherein a top surface of the separation insulating pattern is at a same vertical level as top surfaces of the plurality of vertical structures.

7. An electronic system, comprising:

a main substrate;

a semiconductor device on the main substrate; and a controller on the main substrate and electrically connected to the semiconductor device, wherein the semiconductor device comprises:

a substrate including a cell array region and a connection region arranged along a first direction, the cell array region comprising a center region and an outer region arranged along the first direction, the outer region of the cell array region disposed between the center region of the cell array region and the connection region along the first direction, an electrode structure including a plurality of electrodes and a plurality of pads, the plurality of electrodes vertically stacked on the substrate and spaced apart from each other in a vertical direction perpendicular to the first direction, the plurality of pads disposed over the connection region, a plurality of vertical structures in the cell array region extending through the electrode structure in the vertical direction, the plurality of vertical structures comprising:

a plurality of central vertical structures disposed in the center region of the cell array region, and a plurality of peripheral vertical structures disposed in the outer region of the cell array region, and a separation insulating pattern extending through an upper electrode of the plurality of electrodes, the separation insulating pattern dividing the upper electrode into at least two portions arranged in a second direction perpendicular to the first direction and the vertical direction, wherein the plurality of central vertical structures comprises a first vertical structure, which overlaps with the separation insulating pattern, the plurality of peripheral vertical structures comprises a second vertical structure, which overlaps with the separation insulating pattern, when viewed on a plane perpendicular to the vertical direction, an overlapping area between the first vertical structure and the separation insulating pattern is larger than an overlapping area between the second vertical structure and the separation insulating pattern, and wherein, when viewed on the plane perpendicular to the vertical direction, a center of the second vertical structure of the plurality of peripheral vertical structures is spaced apart from the separation insulating pattern.

8. The electronic system of claim 7, further comprising:

bit lines on the cell array region and extending in the second direction, and wherein the plurality of peripheral vertical structures are electrically isolated from the bit lines.

* * * * *